United States Patent
Sato et al.

(10) Patent No.: US 6,806,021 B2
(45) Date of Patent: Oct. 19, 2004

(54) METHOD FOR FORMING A PATTERN AND METHOD OF MANUFACTURING SEMICONDUCTOR DEVICE

(75) Inventors: Yasuhiko Sato, Yokosuka (JP); Yasunobu Onishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 10/109,714

(22) Filed: Apr. 1, 2002

(65) Prior Publication Data

US 2003/0064323 A1 Apr. 3, 2003

(30) Foreign Application Priority Data

Apr. 2, 2001 (JP) .......................................... 2001-103727
May 14, 2001 (JP) .......................................... 2001-143065

(51) Int. Cl.[7] .............................. B05D 3/00; H01L 21/00
(52) U.S. Cl. ....................... 430/198; 430/311; 430/313; 427/226; 438/778
(58) Field of Search ................................ 430/198, 311, 430/313; 427/226; 438/778

(56) References Cited

U.S. PATENT DOCUMENTS

| 4,826,564 A | * | 5/1989 | Desilets et al. ............. 430/313 |
| 4,847,345 A | * | 7/1989 | Takamizawa et al. ......... 528/35 |
| 5,747,623 A | * | 5/1998 | Matsuo et al. ................ 528/14 |
| 5,789,141 A | * | 8/1998 | Usujima ..................... 430/313 |
| 5,976,618 A | * | 11/1999 | Fukuyama et al. ......... 427/226 |
| 6,174,564 B1 | * | 1/2001 | Scott et al. .............. 427/126.3 |
| 6,251,804 B1 | * | 6/2001 | Chen ......................... 438/778 |

FOREIGN PATENT DOCUMENTS

| JP | 2000-100699 | 4/2000 |
| JP | 2000-221699 | 8/2000 |

* cited by examiner

Primary Examiner—Mark F. Huff
Assistant Examiner—Kripa Sagar
(74) Attorney, Agent, or Firm—Finnegan, Henderson, Farabow, Garrett & Dunner, L.L.P.

(57) ABSTRACT

Disclosed is a method of forming a pattern comprising coating a solution containing a compound having a silicon-nitrogen linkage in the main chain thereof over a surface of a working film to form a mask, replacing the nitrogen in the mask by oxygen, forming a resist film on a surface of the mask, forming a resist pattern by subjecting the resist film to a patterning exposure and to a developing treatment, transcribing the resist pattern to the mask to form a masking pattern, and transcribing the masking pattern to the working film to form a working film pattern.

21 Claims, 4 Drawing Sheets

METHOD FOR FORMING A PATTERN AND METHOD OF MANUFACTURING SEMICONDUCTOR DEVICE

CROSS-REFERENCE TO RELATED APPLICATIONS

This application is based upon and claims the benefit of priority from the prior Japanese Patent Applications No. 2001-103727, filed Apr. 2, 2001; and No. 2001-143065, filed May 14, 2001, the entire contents of both of which are incorporated by reference.

BACKGROUND OF THE INVENTION

1. Field of the Invention

This invention relates to a method of forming a pattern and to a method of manufacturing a semiconductor device. In particular, this invention relates to a method of forming a fine pattern on a wafer substrate.

2. Description of the Related Art

The method of manufacturing a semiconductor element involves a patterning step wherein a plurality of materials are deposited on the surface of silicon wafer to form a thin film as a working film (i.e. a film to be worked, the same hereinafter), which is then formed into a desired pattern. In the patterning process of a working film, first of all, a photosensitive material which is generally called "resist" is deposited on the working film to form a resist film, and then, a predetermined region of the resist film is subjected to an exposure treatment. Then, the exposure region or non-exposure region of the resist film is removed by a developing treatment to form a resist pattern, which is then employed as an etching mask to dry-etch the working film.

As for the exposure light source to apply a light exposure to a predetermined region of the resist film, ultraviolet ray such as a KrF excimer laser, ArF excimer laser, etc. has been employed in view of throughput. Nowadays however, due to a trend to further increase the fineness in dimension of LSI, the resolution for realizing such a fineness of LSI is required to be that of the exposure wavelength or less, so that the process margin (or tolerance) for exposure such as the tolerance in quantity of exposure, focusing tolerance, etc. is getting too limited to realize such a fineness of LSI. It would be effective, for the purpose of supplementing these process margins, to make thinner the thickness of resist film to improve the resolution. However, the thinner resist process would give rise to another problem that it is difficult to secure a sufficient film thickness of resist film which is necessary for suitably etching the working film.

There has been proposed, with a view to solve the aforementioned problems, a so-called multi-layer resist process, i.e. a method wherein a resist pattern is once transcribed to a silicon oxide film to form a silicon oxide film pattern. According to this method, the silicon oxide film pattern thus formed is employed as an etching mask to dry-etch the working film, thus transcribing the pattern to the working film. As for the silicon oxide film to be employed in this case, there has been employed a spin-on glass which can be made into a film at a low cost by a coating method such as spin-coating without necessitating a vacuum system. However, since this spin-on glass is formed into a film by a coating method, it is difficult to obtain a film of high density as compared with the films to be obtained by a physico-chemical method such as a CVD method or a sputtering method. Therefore, the film to be formed using the spin-on glass is poor in etching resistance as compared with a silicon oxide film formed by a physicochemical method, so that etch bias is most likely to be generated on the occasion of etching work of the working film.

BRIEF SUMMARY OF THE INVENTION

A method for forming a pattern according to one embodiment of the present invention comprises:

coating a solution containing a compound having a silicon-nitrogen linkage in the main chain thereof on a surface of a working film to form a mask;

replacing the nitrogen in the mask by oxygen;

forming a resist film on a surface of the mask;

forming a resist pattern by subjecting the resist film to a patterning exposure and to a developing treatment;

transcribing the resist pattern to the mask to form a masking pattern; and transcribing the masking pattern to the working film to form a working film pattern.

A method for forming a pattern according to another embodiment of the present invention comprises:

coating a solution containing a compound having a semiconductor element-oxygen linkage or a metallic element-oxygen linkage in the main chain thereof on a surface of a working film to form a mask;

forming a resist film on a surface of the mask;

forming a resist pattern by subjecting the resist film to a patterning exposure and to a developing treatment;

transcribing the resist pattern to the mask to form a masking pattern; and dry-etching the working film with the masking pattern as a mask to form a working film pattern;

wherein an energy beam is irradiated to the mask or to the masking pattern.

A method for manufacturing a semiconductor device according to one embodiment of the present invention comprises:

forming a working film on a surface of a semiconductor substrate having element regions formed therein;

coating a solution containing a compound having a silicon-nitrogen linkage in the main chain thereof on a surface of a working film to form a mask;

replacing the nitrogen in the mask by oxygen;

forming a resist film on a surface of the mask;

forming a resist pattern by subjecting the resist film to a patterning exposure and to a developing treatment;

transcribing the resist pattern to the mask to form a masking pattern; and transcribing the masking pattern to the working film to form a working film pattern.

A method for manufacturing a semiconductor device according to another embodiment of the present invention comprises:

forming a working film on a surface of a semiconductor substrate having element regions formed therein;

coating a solution containing a compound having a semiconductor element-oxygen linkage or a metallic element-oxygen linkage in the main chain thereof on a surface of a working film to form a mask;

forming a resist film on a surface of the mask;

forming a resist pattern by subjecting the resist film to a patterning exposure and to a developing treatment;

transcribing the resist pattern to the mask to form a masking pattern; and dry-etching the working film with the masking pattern being employed as a mask to form a working film pattern;

wherein an energy beam is irradiated to the mask or to the masking pattern.

DETAILED DESCRIPTION OF THE INVENTION

Next, the method of forming a pattern according to various embodiments of the present invention will be explained in details.

(Embodiment 1)

FIGS. 1A to 1F respectively shows a cross-sectional view illustrating in step-wise one example of forming a pattern according to this Embodiment 1.

Figure 1A:
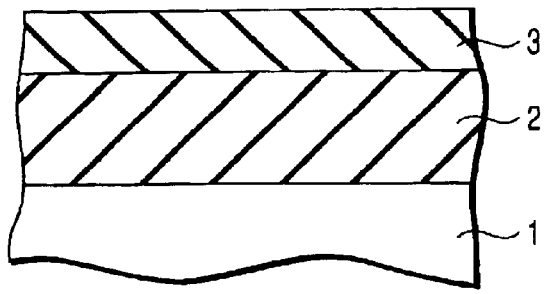
FIGS. 1A to 1F respectively shows a cross-sectional view illustrating in step-wise the process of forming a pattern according to one embodiment of the present invention.

First of all, as shown in FIG. 1A, a mask 3 is formed on the surface of a working film (i.e. a film to be worked) 2 formed on a wafer. The working film 2 according to this embodiment can be formed directly or through a thin film such as an interlayer insulating film on the surface of a semiconductor wafer (not shown) having element regions (not shown) formed therein. Therefore, the reference numeral 1 in FIG. 1A represents a wafer or a film formed immediately underneath the working film 2. As for the material of the working film 2, there is not any particular limitation, so that it may be optionally selected as long as it is capable of being etched at a high selectivity relative to silicon oxide. For example, the working film 2 may be a wiring material such as aluminum, aluminum silicide, copper, tungsten, titanium, titanium nitride, etc.; an electrode material such as polysilicon, tungsten silicide, cobalt silicide, ruthenium, etc.; a silicon-based material such as amorphous silicon, a silicon substrate, etc.; an organic interlayer insulating film such as polyimide, polyarylene ether, etc.; or a lower layer resist film to be employed in a multi-layer resist process such as novolac resin, polyimide, polyacenaphthylene, polyarylene, polyarylene ether, etc.

In particular, according to this embodiment, it is preferable that the working film 2 is formed of an organic material comprising a compound having carbon atom, which is suited for use in an organic interlayer insulating film, or a multi-layer resist process. The working film formed of this kind of organic material is preferable, because it can be worked with a high selectivity relative to the mask 3 to be formed thereon. In this case, it is preferable that the content of carbon in the working film 2 is 30% by weight or more. Because, if the content of carbon is less than 30% by weight, it would become difficult to work the working film 2 with a sufficient selectivity relative to the mask 3.

The mask 3 is formed on the surface of the working film 2 by coating a solution thereon. This coating method can be performed without necessitating a vacuum system and with the employment of a simple process, thereby making it possible to cheaply form a film thereof.

Now, the method of forming a mask by a coating method will be explained. First of all, a silicon compound having a silicon-nitrogen linkage in the main chain thereof is dissolved in a solvent to prepare a solution. As for the silicon compound having a silicon-nitrogen linkage in the main chain thereof, it is possible to employ polysilazane which can be represented by the following general formula.

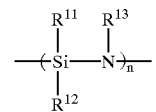

wherein $R^{11}$, $R^{12}$ and $R^{13}$ individually represents nitrogen atom, hydrogen atom, or substituted or unsubstituted aliphatic hydrocarbon or aromatic hydrocarbon having 1 to 20 carbon atoms; and n is an integer.

The polysilazane to be employed for forming the mask may be a homopolymer or copolymer. Alternatively, the polysilazane may be constructed such that two or more kinds of polysilazane are linked to each other through oxygen atom, nitrogen atom, an aliphatic group or an aromatic group. Further, these compounds may contain a silicon-silicon linkage or a silicon-oxygen linkage.

Preferably, the aforementioned silicon compound contains silicon at a ratio of 5 to 80% by weight and nitrogen at a ratio of 5 to 80% by weight. If the content of both silicon and nitrogen is less than 5% by weight, it would be difficult to provide the silicon compound with a sufficient etching resistance. On the other hand, if the content of both silicon and nitrogen exceeds over 80% by weight, the coating performance of the silicon compound may be deteriorated. Specific examples of polysilazane which can be employed in this embodiment include compounds represented by the following chemical formulas.

(1-1)

(1-2)

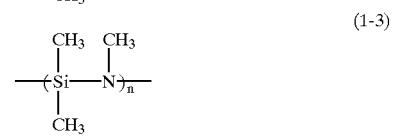

(1-3)

(1-4)

(1-5)
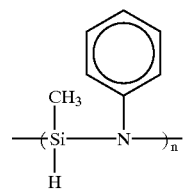
(1-6)
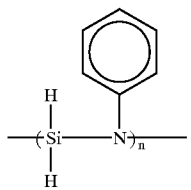
(1-7)
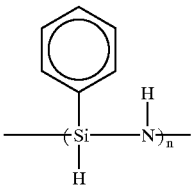
(1-8)
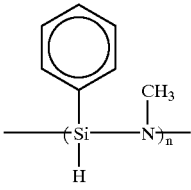
(1-9)
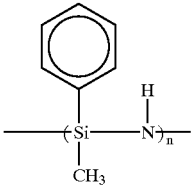
(1-10)
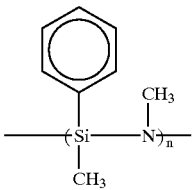
(1-11)
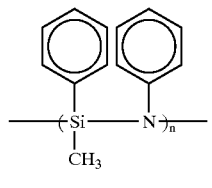
(1-12)
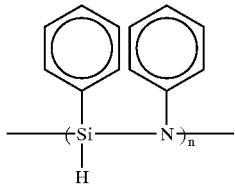
(1-13)
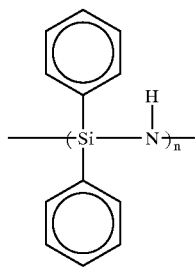
(1-14)
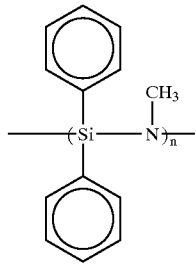
(1-15)
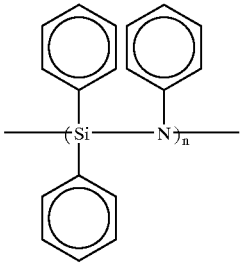
(1-16)
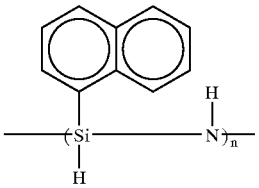
(1-17)
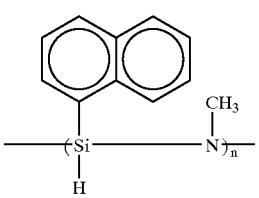
(1-18)
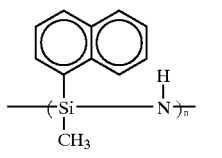
(1-19)
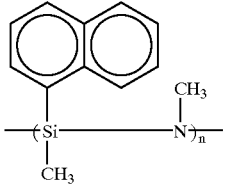

(1-20)
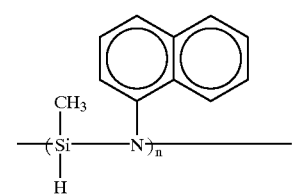
(1-21)
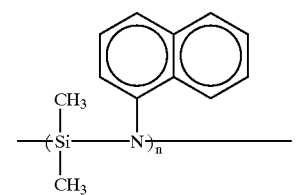
(1-22)
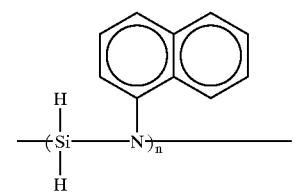
(1-23)
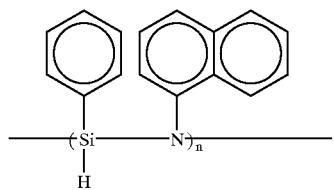
(1-24)
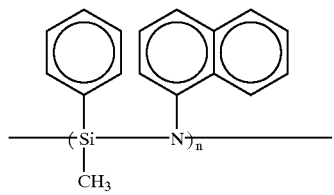
(1-25)
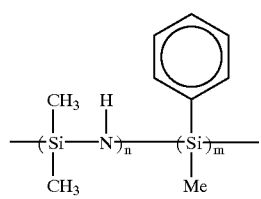
(1-26)
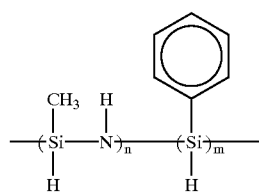
(1-27)
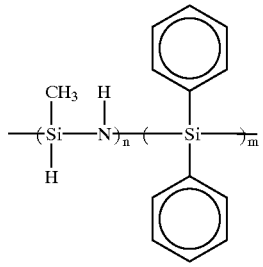
(1-28)
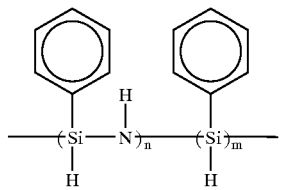
(1-29)
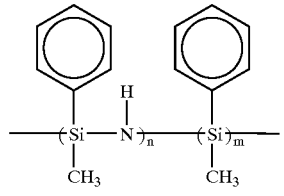
(1-30)
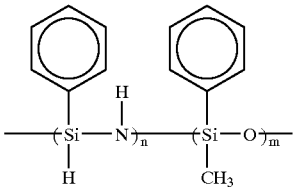
(1-31)
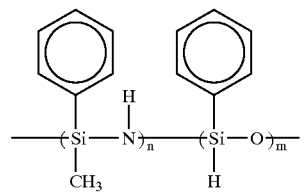
(1-32)
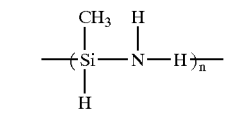
(1-33)
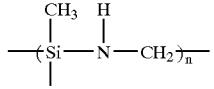
(1-34)
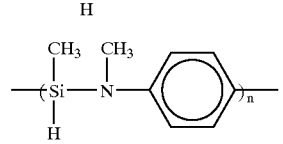
(1-35)
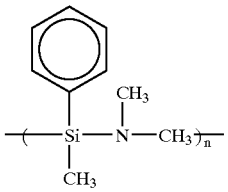

-continued

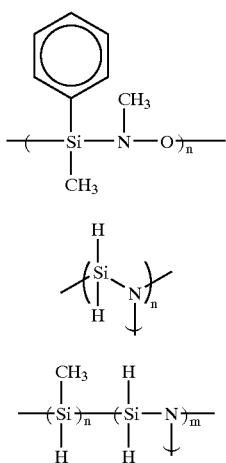

(1-36)

(1-37)

(1-38)

wherein m and n represent individually a positive integer.

Although there is not any particular limitation with respect to the average molecular weight of these silicon compounds, the average molecular weight thereof should preferably be within the range of 200 to 100,000. Because if the average molecular weight thereof less than 200, the mask may be caused to dissolve in a solvent for the resist. On the other hand, if the average molecular weight thereof exceeds over 100,000, it becomes difficult to dissolve these silicon compounds in a solvent, thereby making it difficult to prepare a solution thereof. These silicon compounds can be employed not only singly but also in combination of two or more kinds thereof.

By dissolving the aforementioned silicon compounds in a predetermined solvent, a coating material can be prepared for using it as a mask. As for the solvent to be employed in this case, there is not any particular limitation. For example, it is possible to employ a ketone-based solvent such as acetone, methylethyl ketone, methylisobutyl ketone, cyclohexanone, etc.; a cellosolve-based solvent such as methyl cellosolve, methyl cellosolve acetate, ethyl cellosolve acetate, etc.; an ester-based solvent such as ethyl lactate, ethyl acetate, butyl acetate, isoamyl acetate, etc.; an alcohol-based solvent such as methanol, ethanol, isopropanol, etc.; anisole; toluene; xylene; and naphtha.

If required, the following additives may be added to the aforementioned solution. For instance, it is possible to employ a thermal polymerization inhibitor for enhancing a storage stability, an adhesion improver for enhancing the adhesion of the masking material to a working film, dye for absorbing ultraviolet ray in order to prevent light from reflecting from a working film into a resist film, a polymer such as polysulfone and polybenzimidazole for absorbing ultraviolet ray, an electrically conductive material for preventing electric charge from being accumulated in a resist film on the occasion of electron beam exposure, a material which is capable of generating electric conductivity as it is exposed to light or heat, a cross-linking agent which is capable of cross-linking a silicon compound to provide it with solvent resistance, heat resistance, and a free radical generating agent for promoting the cross-linking of silicon compounds.

A coating material prepared as described above is coated on the surface of the working film 2 by a spin-coating method for instance. Then, the solvent is heated to evaporate to form the mask 3. The film thickness of the mask 3 formed herein should preferably be within the range of 1 to 1000 nm. If the film thickness of the mask 3 is less than 1 nm, it may become difficult to sufficiently secure the function of the masking material for etching the working film 2. On the other hand, if the film thickness of the mask 3 is larger than 1000 nm, a dimensional etch bias may be caused to generate prominently on the occasion of transcribing a resist pattern to the mask by dry etching method.

Then, the nitrogen in the mask 3 is replaced by oxygen. As a compound having a silicon-nitrogen linkage in the main chain thereof is heated or irradiated with an energy beam, nitrogen included in the compound is dissociated therefrom as shown in the following reaction formula and oxygen atom is permitted to bond to a dangling bond generated in silicon atom. As a result, a silicon oxide-like film 4 as shown in FIG. 1B can be obtained. Since the mask is densified in the course of the substitution reaction of oxygen for nitrogen, a film of high density can be obtained.

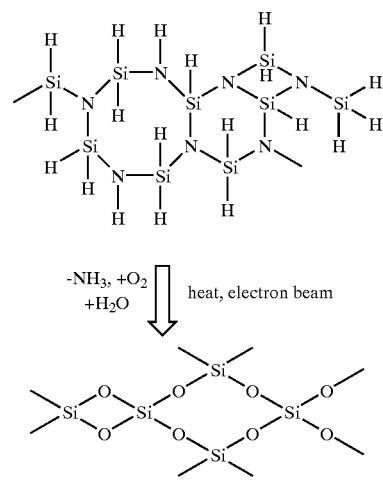

The substitution ratio of oxygen for nitrogen should preferably be 20% or more, most preferably 80% or more based on the total content of nitrogen in the silicon compound included in the solution. If the substitution ratio is less than 20%, it would be impossible to sufficiently improve the etching resistance of the mask due to this insufficient substitution. By the way, since both nitrogen and oxygen are required to exist for the progress of the substitution reaction, the heating or the irradiation of energy beam should preferably be performed while permitting the mask to expose to an atmosphere containing moisture and oxygen. In this case, the humidity in the atmosphere should preferably be 10% or more, and the oxygen concentration in the atmosphere should preferably be 10% or more. When the humidity and oxygen concentration in the atmosphere are controlled to 10% or more, the substitution reaction of oxygen for nitrogen can be effectively and sufficiently proceeded, thereby making it possible to obtain a film of high density.

In the case where nitrogen is replaced by oxygen by heating, the heating temperature should preferably be confined to the range of 200° C. to 500° C. If the heating temperature is lower than 200° C., the substitution reaction of oxygen for nitrogen would not be sufficiently proceeded. On the other hand, if the heating temperature exceeds over 500° C., the working film 2 may be denatured. The heating under such a temperature range can be performed using a hot plate or an oven. It is also possible to perform the heating by a multi-stage baking.

In the case where nitrogen in the mask is replaced by oxygen by the irradiation of energy beam, a light beam having a wavelength selected from the range of 1 nm to 1 mm or an electron beam can be employed. It is more preferable to employ a light beam having a wavelength selected from the range of 100 nm to 800 nm. Although there is not any particular limitation with respect to the exposure dose of light and electron beam, the exposure dose should preferably be confined within the range of 1 mJ/cm$^2$ to 1000 J/cm$^2$ if light beam is to be employed, or within the range of 1 $\mu$C/cm$^2$ to 1000 C/cm$^2$ if electron beam is to be employed. In either cases, if the exposure dose is less than the aforementioned lower limit, it would become difficult to sufficiently proceed the substitution reaction of oxygen for nitrogen. On the other hand, if the exposure dose is higher than the aforementioned upper limit, it would take a long time for the substitution reaction, thus leading to the deterioration of throughput. Further, the aforementioned heating and energy beam irradiation may be concurrently performed in the substitution reaction of oxygen for the nitrogen in the mask.

Figure 1D:
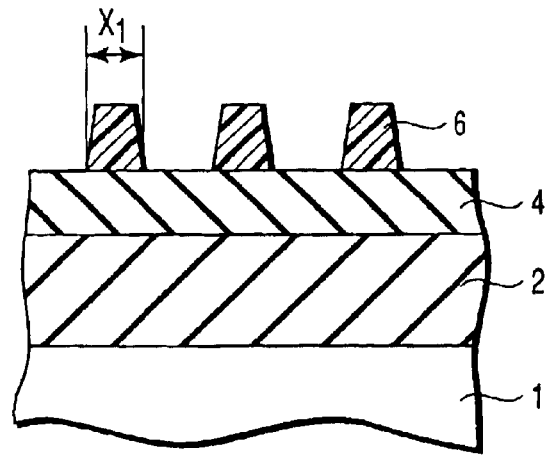
Figure 1B:
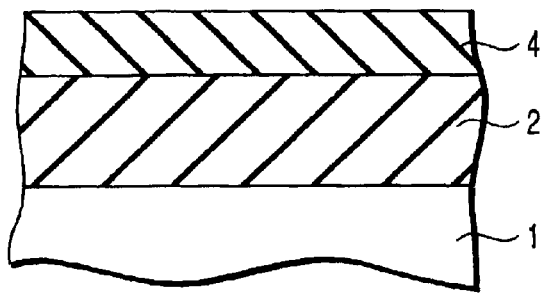
Figure 1E:
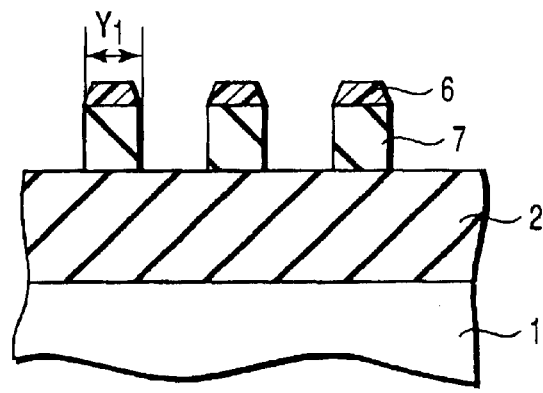
Figure 1C:
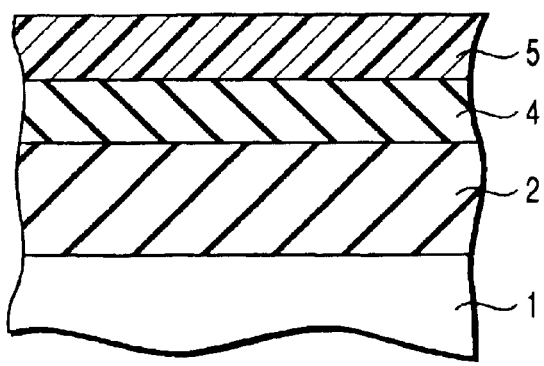

After the mask 4 is densified through the substitution reaction of oxygen for the nitrogen, a solution of the resist is spin-coated on the surface of the densified mask 4 and then heat-treated to evaporate the solvent contained therein, thus forming a resist film 5 as shown in FIG. 1C. It is possible, by thinning the film thickness of the resist film 5, to proportionally enhance the tolerance in quantity of exposure, focusing tolerance or the resolution at the moment of exposure. Therefore, the film thickness of the resist film 5 should be as thin as possible so long as the mask 4 can be etched with excellent dimensional controllability. More specifically, the film thickness of the resist film 5 should preferably be within the range of 100 to 10,000 nm, more preferably 100 to 400 nm. If the film thickness of the resist film 5 is smaller than 100 nm, it may become difficult to perform the working of the mask with excellent dimensional controllability. On the other hand, if the film thickness of the resist film 5 is larger than 10,000 nm, the lithography process window may be degradated.

As for the composition of the resist for forming the resist film 5, there is not any particular limitation as long as the composition is capable of being patterned through the exposure thereof to a visible ray or ultraviolet ray, and therefore, the composition of the resist may be either negative or positive in type, that can be selected depending on the end-use thereof. Specific examples of such a positive resist are a resist composition comprising naphthoquinone diazide and novolak resin (IX-770, JSR Co.); a chemical amplification type resist composition comprising polyvinylphenol resin protected by t-BOC and an acid-generating agent (APEX-E, Shipley Co.); and a resist composition comprising polymethacrylate protected by an aliphatic hydrocarbon group and an acid-generating agent. Specific examples of such a negative resist are, for instance, a chemical amplification type resist comprising polyvinylphenol, melamine resin and a photo-acid generating agent (SNR248, Shipley Co.), and a resist comprising polyvinylphenol and a bisazide compound (RD-2000, Hitachi Kasei Co., Ltd.). It should be noted that the resist useful in this embodiment is not confined to these compositions.

A solution of any one of these resist compositions is coated on the mask 4 by a spin coating method, etc. and then heated in a hot plate or an oven to evaporate the solvent to form the resist film 5.

Then, a patterning exposure is performed on the resist film 5. As for the light source for the exposure light, there is not any particular limitation and hence it may be ultraviolet ray, electron beam, ion beam, etc. More specifically, as for the ultraviolet radiation, it may be g-ray (wavelength=436 nm) or i-ray (wavelength=365 nm) of a mercury lamp, or an excimer laser such as XeF (wavelength=351 nm), XeCl (wavelength=308 nm), KrF (wavelength=248 nm), KrCl (wavelength=222 nm), ArF (wavelength=193 nm), F$_2$ (wavelength=157 nm), etc. Upon finishing the exposure, the resultant resist film may be subjected to a post-exposure baking, if required.

Thereafter, the resist film is subjected to a developing treatment using an aqueous inorganic alkaline solution such as an aqueous solution of tetramethyl ammonium, sodium hydroxide, potassium hydroxide, etc., or using an organic solvent such as xylene, acetone, etc., thereby forming a resist pattern 6 as shown in FIG. 1D.

If necessary, an upper anti-reflection layer for minimizing multiple reflection inside the resist film that may be generated on the occasion of light exposure process may be formed on an upper layer of the resist film 5. Alternatively, an upper layer antistatic film for preventing the charge-up that may be generated on the occasion of electron beam exposure process may be formed on an upper layer of the resist film 5.

Since the mask 4 to be formed in this embodiment is high in polarity, a developing solution may be permitted to enter into an interface between the resist pattern 6 and the mask 4, thereby causing the resist pattern 6 to peel away from the mask 4 after the developing treatment of the resist film. When a hydrophobilization treatment is applied to the mask in such a case, the penetration of a developing solution into an interface between the resist pattern and the mask can be inhibited, thereby making it possible to prevent the resist pattern 6 from being peeled away from the mask 4. As for the hydrophobilization treatment, it is possible to employ a method wherein the mask 4 is exposed to an atmosphere which is formed through the evaporation of hexamethyl disilazane, thereby permitting the hydroxyl group of the surface of the mask to be replaced by methyl group.

By-products such as ammonia may be generated in the aforementioned hydrophobilization treatment. Therefore, it is desirable to remove these by-products by baking treatment which can be performed at a temperature ranging from 150° C. to 500° C. As long as the baking treatment is performed under this temperature range, the by-products can be sufficiently removed without inviting the denaturing of the mask. It is more preferable that the upper limit of the baking temperature is confined to not higher than 350° C. This baking treatment for removing the by-products can be performed using a hot plate or an oven. It is also possible to perform this baking treatment by a multi-stage baking.

By the way, in the case where a chemical amplification type resist is employed for the formation of the resist film 5, the resist profile to be obtained may be deteriorated due to the presence of a basic substance. For example, when a basic substance is permitted to remain inside the mask 4, an acid generated in the resist film 5 by the exposure treatment thereof may be deactivated. If this deactivation is to be avoided, it is preferable to perform the heating treatment of the mask at a temperature of not lower than 150° C. immediately before the deposition of the resist film 5 thereon to permit the basic substance to be evaporated and eliminated from the mask 4. The upper limit of the temperature to be employed in this heat treatment should preferably be not higher than 500° C., more preferably not higher than 350° C. Because, if the heating temperature exceeds over 500° C., the working film may be possibly denatured. The baking at this range of temperature can be performed using a hot plate or an oven. It is also possible to perform this baking by a multi-stage baking.

If it is impossible to obtain a sufficient adhesion between the resist pattern 6 and the mask 4, or to sufficiently evaporate the basic substance which is left remained in the mask 4 even if the aforementioned procedures are adopted, a thin film (not shown) may be formed in advance on the surface of the mask, and then, the resist film 5 is formed on the thin film, the resist film 5 being subsequently patterned to form a resist pattern 6. In order to minimize the etch bias of working on the occasion of etching this thin film, the thickness of the thin film should preferably be as thin as possible, e.g. preferably within the range of 5 to 500 nm, more preferably 10 to 100 nm. Examples of the material for such a thin film include polymethyl siloxane, polymethylmethacrylate, polysulfone, etc. The thin film should preferably be formed by using of a coating method in view of the throughput.

Then, by using the resultant resist pattern 6 as a mask, the mask 4 is dry-etched, thereby transcribing the shape of the resist pattern 6 to the mask to obtain a mask pattern 7 as shown in FIG. 1E. As for the etching method, there is not any particular limitation as long as it is capable of performing a fine working, examples of such an etching method including a reactive ion etching, a magnetron type reactive ion etching, an electron beam ion etching, an ICP etching and an ECR ion etching.

As for the source gas to be employed on this occasion, a source gas containing fluorine can be preferably employed. Examples of such a source gas include $CF_4$, $C_4F_8$, $CHF_3$, $CF_3Cl$, $CF_2Cl_2$, $CF_3Br$, $CCl_4$, $C_2F_5Cl_2$ and $SF_6$. These source gases may be combined with each other for use, or may be used with an addition of Ar, $N_2$, $O_2$ or CO. When an etching is performed by using a source gas containing fluorine, the mask 4 can be etched several times faster as compared with the etching rate of the resist film 5. As a result, even if the thickness of the resist film 5 is formed thinner, the resist pattern 6 can be prevented from being etched away at an intermediate portion thereof, thereby making it possible to obtain a mask pattern 7 which is exactly the same as the dimension of the resist pattern 6.

Figure 1F:
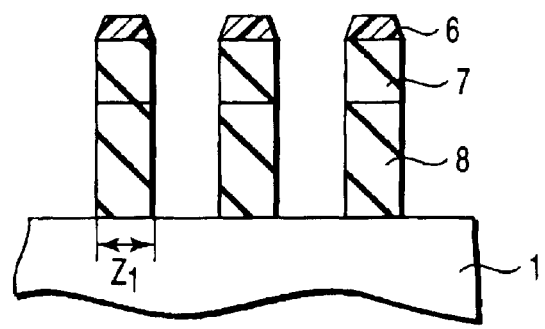

Further, by using the resist pattern 6 and the mask pattern 7 as an etching mask, the working film 2 is etched by a dry etching method to form a working film pattern 8 as shown in FIG. 1F. As for the etching method, there is not any particular limitation as long as it is capable of performing a fine working, examples of such an etching method including a reactive ion etching, a magnetron type reactive ion etching, an electron beam ion etching, an ICP etching and an ECR ion etching. As for the etching gas to be employed on this occasion, it is preferable to employ a source gas containing at least one kind of material selected from the group consisting of oxygen, nitrogen, bromine and chlorine. The reason for this is the etching resistance of the mask 4 to be formed in this embodiment, which is excellent under the etching conditions where a source gas containing at least one kind of material selected from the group consisting of oxygen, nitrogen, bromine and chlorine is employed. As a result, it is possible to obtain a working film pattern 8 wherein the mask pattern 7 is transferred thereto without generating a etch bias.

In this embodiment, a thin film may be interposed at an interface between the substrate wherein elements are formed and the working film 2. The thin film to be formed in this case may be constituted by an interlayer insulating film comprising for example of $SiO_2$, wherein the working film 2 is employed as an lower resist in a multi-layer resist process. Namely, when the working film pattern 8 formed as mentioned above is employed as an lower resist in a multi-layer resist process, the interlayer insulating film underlying the lower resist can be worked with excellent dimensional controllability.

Next, this embodiment will be further explained in detail with reference to specific examples.

(Embodiment I-1)

First of all, as the working film 2, an interlayer insulating film having a thickness of 500 nm and comprising polyarylene ether as a main component was formed on the surface of silicon wafer 1 having element regions (not shown) formed therein.

Then, by the procedures shown in the following items (S1)–(S4), the mask shown in FIG. 1A was formed on the surface of the working film 2.

(S1) 10 g of polysilazane (average molecular weight: 2,000) employed as a silicon compound and represented by the aforementioned chemical formula (1-37) was mixed with 90 g of anisole to prepare a solution of masking material. This solution was then spin-coated on the surface of the working film 2.

(S2) 9.99 g of polysilazane (average molecular weight: 2,000) employed as a silicon compound and represented by the aforementioned chemical formula (1-37), 0.01 g of a compound employed as an acid-generating agent and represented by the chemical formula shown below, and 90 g of anisole were mixed together to prepare a solution of masking material.

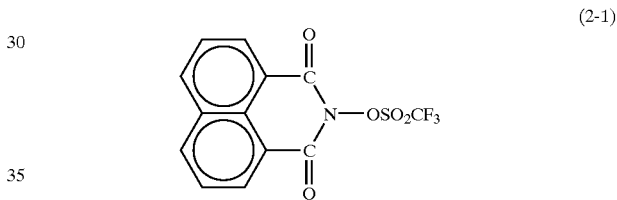

(2-1)

This solution was then coated on the surface of the working film 2 in the same manner as described above.

(S3) 9.99g of polysilazane (average molecular weight: 2,000) employed as a silicon compound and represented by the aforementioned chemical formula (1-37), 0.01 g of an acid represented by the chemical formula (2-2) shown below, and 90 g of anisole were mixed together to prepare a solution of masking material.

$CH_3SO_3H$            (2-2)

This solution was then coated on the surface of the working film 2 in the same manner as described above.

(S4) At first, the mask is formed as described in the (S1) and baked as described later. Then, polymethyl siloxane was dissolved in polyisopropanol to prepare a solution for forming the aforementioned thin film. The solution thus obtained was coated on the surface of the mask formed in the method of (S1) to form a thin film having a thickness of 20 nm.

The masks which were formed in the aforementioned procedures (S1)–(S3) and the thin film which was formed in the aforementioned procedure (S4) were subjected to baking treatment at a temperature of 180° C. for 60 seconds, and then, to additional baking treatment in air atmosphere at a temperature of 300° C. for 60 seconds. As a result, the nitrogen in the mask 3 was replaced by oxygen to obtain a densified mask 4 as shown in FIG. 1B.

Then, by an X-ray spectroscopic analysis, the quantity of Si—O bond and of Si—N bond in the mask after the aforementioned baking treatments were investigated in comparison with the quantity of these bonds before the baking treatment, the value of which was provisionally set to 1. Further, by an X-ray total reflection spectroscopy, the density of the masks before and after the baking treatment was investigated, the results obtained are shown together with the ratios of the Si—O bond and of the Si—N bond in the following Table 1.

TABLE 1

| | Si—N bond | Si—O bond | Density (g/cm³) Before substituted | Density (g/cm³) After substituted | Etch bias (nm) Y-X | Etch bias (nm) Y-Z | Selectivity ratio |
|---|---|---|---|---|---|---|---|
| (S1) | 0.050 | 20.3 | 1.87 | 2.25 | −2 | −4 | 8.7 |
| (S2) | 0.050 | 20.3 | 1.87 | 2.25 | +2 | −4 | 8.7 |
| (S3) | 0.050 | 20.3 | 1.87 | 2.25 | +1 | −4 | 8.7 |
| (S4) | 0.050 | 20.3 | 1.87 | 2.25 | +1 | −4 | 8.7 |

As shown in Table 1, while the quantity of the Si—N bond in the mask was decreased due to the baking treatment, the quantity of the Si—O bond was increased. The reasons for these results can be assumably attributed to the facts that due to the baking treatment, the nitrogen of the Si—N bond was caused to dissociate from the bond, thereby generating a dangling bond, to which oxygen was then allowed to bond, thus substituting oxygen for the nitrogen. Further, due to the baking treatment, the density of every masks was enabled to increase up to 2.25 g/cm². Since the density of the $SiO_2$ film to be formed by LPCVD method which has been known as being capable of obtaining a film of high density is 2.1 g/cm², it would be clear that even if a coating method is employed, it is now possible, according to the method of this embodiment, to obtain a mask having the same degree of density as that obtainable by the LPCVD method. The reasons for the result can be assumably attributed to the fact that due to the baking treatment at a temperature of 300° C. for 60 seconds, a dangling bond was caused to generate in silicon of the mask, and oxygen was allowed to re-combine with the dangling bond, thereby densifying the mask.

The masks formed in the aforementioned procedures (S1)–(S3) were allowed to expose to the vapor of hexamethyl disilazane to perform the hydrophobilization treatment thereof. Thereafter, the masks were subjected to a dehydration baking treatment at a temperature of 250° C. for 90 seconds, whereby the ammonia that had been generated as a by-product of the hydrophobilization treatment was enabled to be removed from the surface and interior of the mask 4.

Then, by spin-coating method, a solution of resist was coated on the surface of the mask 4 which was hydrophobilized in advance as described above. The resultant resist layer was baked at a temperature of 130° C. for 90 seconds by using a hot plate to form a resist film 5 as shown in FIG. 1C. The solution of resist employed in this case was prepared as follows. Namely, 9.5 g of an inhibitor resin (average molecular weight: 12,000) represented by the following chemical formula (3-1), and 0.5 g of an acid-generating agent represented by the following chemical formula (3-2) were dissolved in ethyl lactate. The thickness of the resist film 5 thus obtained was 250 nm.

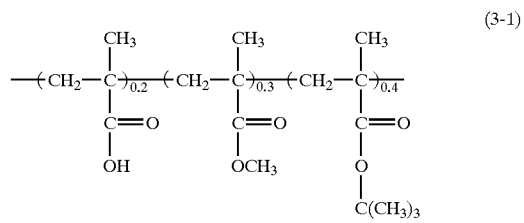
(3-1)

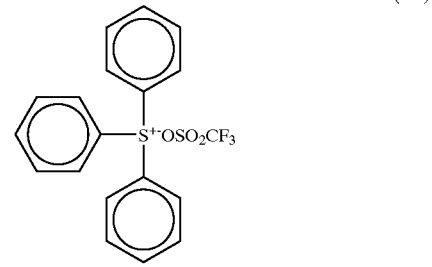
(3-2)

Thereafter, the resist film 5 was subjected to a patterning exposure by using an ArF excimer laser, and then, to a baking treatment at a temperature of 130° C. for 90 seconds by using a hot plate. The resultant resist film 5 was then subjected to a developing treatment using a 0.21N TMAH (tetramethyl ammonium hydroxide) developing solution to form a resist pattern 6 having a 110 nm line-and-space pattern as shown in FIG. 1D.

It was possible, in all of samples of mask, to form a resist pattern without causing the resist pattern 6 to peel away from the mask 4. Further, by using a scanning type electron microscope, the configuration of the resist pattern was observed. As a result, although a footing was recognized on the mask which was formed by the method (S1), such a footing was not recognized on the masks which were formed by the methods (S2)–(S4), thus confirming the formation of resist patterns which were excellent in configuration. Depending on the kinds of resist to use, the acid contained in the resist film 5 may be allowed to diffuse into the mask 4 to generate a footing. It is possible, in that case, to suppress the generation of the footing by adding an acid-generating agent to the mask 4 as in the case of (S2) or by adding an acid to the mask 4 as in the case of (S3), thereby supplementing an acid to a bottom portion of the resist film 5 where the acid is in short. Alternatively, it is also possible to suppress the generation of the footing by providing a thin film at an interface between the mask 4 and the resist film 5 so as to prevent an acid from being diffused into the mask 4.

When the hydrophilicity of the surface of the mask 4 is relatively high as in the case of the films which were formed by the methods (S1)–(S3), the resist pattern 6 may be peeled away from the mask 4 due to the penetration of a developing solution into an interface between the resist pattern 6 and the mask 4. In that case, the peeling of the resist pattern 6 can be suppressed by performing a hydrophobilization treatment to improve the adhesion thereof as described in this embodiment.

Then, by a dry etching method, the resist pattern 6 was transcribed to the mask 4 to form a mask pattern 7 as shown in FIG. 1E. In this case, a magnetron type reactive ion etching apparatus was employed as an etching apparatus under the conditions wherein a $CHF_3/O_2$ gas (flow rate: 100 sccm/20 sccm) was employed as a source gas, the exciting power was set to 1300W, the vacuum degree was set to 75 mTorr, and the temperature of substrate was set to 40° C. By the way, in the case of the method (S4), the thin film deposited on the mask 4 was etched concurrent with the mask 4. The etching time was determined through the detection of the terminal point by luminescence, wherein the etching time was set to such that the etching was continued until the mask 4 was over-etched by 50% relative to the just time.

The dimensional etch bias generated due to the etching of mask 4 was defined as follows and summarized in Table 1. Namely, the dimensional etch bias herein was defined as being a difference between the dimension $Y_1$ of the mask pattern 7 after the etching as shown in FIG. 1E and the dimension $X_1$ of the resist pattern 6 before the etching as shown in FIG. 1D (i.e. the etch bias=$Y_1-X_1$)

As shown in Table 1, the dimensional etch bias in every masks was found as falling within the permissible range of −5 nm to +5 nm, thus indicating that the mask 4 was etched at a high dimensional controllability.

Thereafter, by dry etching method, the mask pattern 7 was transcribed to the working film 2 to obtain a working film pattern 8 as shown in FIG. 1F. In this case, a magnetron type reactive ion etching apparatus was employed as an etching apparatus under the conditions wherein a $N_2/O_2$ (flow rate: 10 sccm/100 sccm) was employed as a source gas, the exciting power was set to 700W, the vacuum degree was set to 40 mTorr, and the temperature of substrate was set to 20° C. The etching time was determined through the detection of the terminal point by luminescence, wherein the etching time was set to such that the etching was continued until the working film 2 was over-etched by 50% relative to the just time.

The dimensional etch bias generated due to the etching of working film 2 was defined as follows and summarized in Table 1. Namely, the dimensional etch bias herein was defined as being a difference between the dimension $Z_1$ of the working film pattern 8 after the etching as shown in FIG. 1F and the dimension $Y_1$ of the mask pattern 7 as shown in FIG. 1E (i.e. the etch bias=$Z_1-Y_1$).

As shown in Table 1, the dimensional etch bias in every masks was found as falling within the permissible range of −5 nm to +5 nm, thus indicating that the working film 2 was worked without substantially generating any discrepancy relative to the dimension of the mask pattern before the etching.

Additionally, the etching process of the working film was suspended in the middle of the etching process, and the etching selectivity between the working film and the mask (=the etching rate of the working film/the etching rate of the mask) was investigated, the results being summarized in Table 1. Further, the $SiO_2$ film formed by an LPCVD method was employed as a mask, and then, the etching selectivity of the mask to the working film was investigated. As a result, the etching selectivity ratio thereof was 8.7. It was found from these results that the masks according to this embodiment exhibited almost the same degree of etching resistance as that of the $SiO_2$ film formed by an LPCVD method. Due to this high etching resistance of the mask, it was possible in this embodiment to perform the etching of the working film 2 without substantially generating any dimensional etch bias.

(Comparative Embodiment I-1)

In this comparative example, a spin-on glass according to the prior art was employed as a mask as explained below.

In the same manner as that of Embodiment I-1, a working film was formed on the surface of a silicon wafer.

10 g of polysiloxane represented by the following chemical formula (R) was dissolved in 90 g of isopropyl alcohol to prepare a solution of masking material.

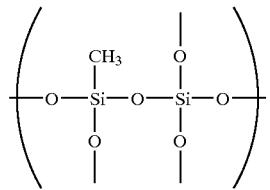

(R)

This solution was then coated on the surface of the working film by a spin-coating method. Then, the resultant coated layer was subjected to a sequence of baking treatments, i.e. 200° C. for 60 seconds and 300° C. for 60 seconds in air atmosphere, thereby forming a mask having a thickness of 80 nm and a density of 1.88 g/cm³.

Then, a resist pattern was formed on the surface of the mask by the same procedures as explained in Embodiment I-1.

Then, by the same procedures as explained in Embodiment I-1, the resist pattern was transcribed to the mask to form a mask pattern, which was then transcribed onto the working film in the same manner as in the case of Embodiment I-1. As a result, the dimensional etch bias on the occasion of transcribing the mask pattern onto the working film was found −20 nm, thus exceeding over the predetermined permissible range and indicating that it was impossible to work the working film with a satisfactory dimensional controllability. Further, when the etching selectivity of the mask relative to the working film was investigated, it was 5.1 which was much lower than that of the mask employed in Embodiment I-1. The reason for this was assumed to be attributed to the poor etching resistance of the mask.

The reason for failing to obtain a sufficient etching resistance when a spin-on glass was employed for forming a film would be attributed to the fact that the film obtained in this manner was low in density. As described above, according to the conventional method wherein a silicon oxide film is formed by coating a solution containing a compound having silicon-oxygen bonds, it is impossible to obtain a silicon oxide film of high density. Whereas, according to one embodiment of this invention, dangling bonds are allowed to generate in silicon contained in the mask and are allowed to recombine with oxygen, thereby obtaining a silicon oxide-like film. As a result, the mask is easily enabled to densify in the course of this recombination, thereby making it possible to obtain a film of high density and to improve the etching resistance of the film.

(Embodiment I-2)

By the same procedures as explained in Embodiment I-1, a mask was formed on a working film. Thereafter, each of the masks was exposed to the irradiation of ultraviolet ray having a wavelength of 157 nm by using an excimer lamp in an $O_2$ atmosphere and under the conditions wherein the exposure dose was set to 100 mJ/cm² and the vacuum degree was set to 15 mTorr, thereby enabling oxygen to substitute for the nitrogen contained in the mask.

The quantity of Si—N bond and of Si—O bond in the mask, and the density of mask after the aforementioned irradiation of electron beam were investigated in the same manner as in Embodiment I-1, the results being shown in the following Table 2.

TABLE 2

| | Si—N bond | Si—O bond | Density (g/cm³) Before substituted | Density (g/cm³) After substituted | Etch bias (nm) Y-X | Etch bias (nm) Y-Z | Selectivity ratio |
|---|---|---|---|---|---|---|---|
| (S1) | 0.05 | 20.3 | 1.87 | 2.23 | −2 | −4 | 8.7 |
| (S2) | 0.05 | 20.3 | 1.87 | 2.23 | +2 | −4 | 8.7 |
| (S3) | 0.05 | 20.3 | 1.87 | 2.23 | +1 | −4 | 8.7 |
| (S4) | 0.05 | 20.3 | 1.87 | 2.23 | +1 | −4 | 8.7 |

As shown in Table 2, in the same manner as in Embodiment I-1, the reaction of substituting oxygen for the nitrogen contained in the mask was found proceeded. Further, the density of the mask was also found improved due to the aforementioned irradiation treatment, thus indicating the enhancement of the density of the mask.

Thereafter, by the same procedures as explained in Embodiment I-1, the resist pattern 6 was transcribed to the mask 4 where oxygen was substituted for nitrogen. Then, the working of the mask and the working film was performed in the same manner as in the case of Embodiment I-1, and the etch bias in the working and the etching selectivity ratio thereof were investigated, the result being summarized in Table 2 described above. As seen from the results shown in Table 2, the masks employed in this embodiment were excellent in etching resistance which was comparable to that of Embodiment I-1, so that it was possible to work the working film with excellent dimensional controllability.

As seen from this embodiment, even if an ultraviolet ray having a wavelength of 157 nm was irradiated onto the mask, it was possible to substitute oxygen for nitrogen, thereby making it possible to obtain the same effects as obtained in the previous embodiment.

(Embodiment I-3)

By the same procedures as explained in Embodiment I-1, a mask was formed on a working film. Thereafter, each of the masks was exposed to the irradiation of electron beam in an $O_2$ atmosphere and under the conditions wherein the accelerating voltage was set to 10 keV, the exposure dose was set to 10,000 $\mu C/cm^2$ and the vacuum degree was set to 15 mTorr, thereby enabling oxygen to substitute for the nitrogen contained in the mask.

The quantity of Si—N bond and of Si—O bond in the mask, and the density of mask after the aforementioned irradiation of electron beam were investigated in the same manner as in Embodiment I-1, the results being shown in the following Table 3.

TABLE 3

| | Si—N bond | Si—O bond | Density (g/cm³) Before substituted | Density (g/cm³) After substituted | Etch bias (nm) Y-X | Etch bias (nm) Y-Z | Selectivity ratio |
|---|---|---|---|---|---|---|---|
| (S1) | 0.01 | 99.9 | 1.87 | 2.4 | +1 | −2 | 11.0 |
| (S2) | 0.01 | 99.9 | 1.87 | 2.4 | +2 | −2 | 11.0 |
| (S3) | 0.01 | 99.9 | 1.87 | 2.4 | +1 | −2 | 11.0 |
| (S4) | 0.01 | 99.9 | 1.87 | 2.4 | +1 | −2 | 11.0 |

As shown in Table 3, the quantity of Si—O bond generated in the mask was larger than that of Embodiment I-1, and the reaction of substituting oxygen for the nitrogen was also found proceeded. Further, the density of the mask was also high, thus indicating the enhancement of the density of the mask.

Thereafter, by the same procedures as explained in Embodiment I-1, the resist pattern 6 was transcribed to the mask where oxygen was substituted for nitrogen. Further, the generation of footing was not recognized in any of the masks. In the case where the reaction of substituting oxygen for nitrogen is proceeded by the irradiation of electron beam as in this embodiment, the density of mask 4 is highly promoted, so that the diffusion of an acid in the resist film 5 would become difficult. Therefore, it may not be necessary to incorporate an acid (as in the case of (S1)) or an acid-generating agent in the mask 4.

Then, the working of the mask and the working film was performed in the same manner as in the case of Embodiment I-1, and the etch bias in the working and the etching selectivity ratio thereof were investigated, the result being summarized in Table 3 described above. As seen from the results shown in Table 3, the masks employed in this embodiment were excellent in etching resistance which was comparable to that of Embodiment I-1, so that it was possible to work the working film with excellent dimensional controllability. Additionally, it was also possible to work the working film with the etch bias in working being controlled smaller than that of the Embodiment I-1. This can be attributed to fact that the mask was more enhanced in density than that of Embodiment I-1 due to the irradiation of electron beam, thereby making it possible to provide the mask with an enhanced etching resistance.

In a case where nitrogen is substituted by oxygen through the irradiation of electron beam onto the mask as in the case of this embodiment, the density of the mask can be further enhanced.

(Embodiment I-4)

This embodiment illustrates a case wherein a working film pattern was formed by a pattern-forming method according one embodiment of this invention, and the resultant working film pattern was employed as a lower resist film in a multi-layer resist process. In this embodiment, an $SiO_2$ film was formed immediately underneath the working film pattern, and this working film pattern was transcribed onto this $SiO_2$ film to form an $SiO_2$ film pattern.

First of all, an $SiO_2$ film having a thickness of 500 nm was formed as an interlayer insulating film on the surface of a silicon wafer having element regions formed therein. The interlayer insulating film formed herein corresponds to the layer indicated by a reference number 1 in FIG. 1.

Then, a working film was formed on the surface of the interlayer insulating film as explained below. Namely, at first, 10 g of novolac resin having a average molecular weight of 12,000 was dissolved in 90 g of ethyl lactate to prepare a solution for forming the working film. This solution was then spin-coated on the surface of the interlayer insulating film. Thereafter, the resultant layer was heat-treated at a temperature of 180° C. for 60 seconds and then, at a temperature of 300° C. for 120 seconds by using a hot plate to form a working film 2 having a thickness of 500 nm.

Then, by using the same procedures as those of Embodiment I-1, a mask 3 was formed on the surface of the working film 2.

Further, by using the same method as that of Embodiment I-1, electron beam was irradiated onto the resultant mask 3 to enable the nitrogen existing inside the mask to be substituted by oxygen. When the ratio of the substitution, i.e. from nitrogen to oxygen, was investigated by X-ray spectroscopy, the substitution of oxygen for nitrogen was confirmed as having proceeded to the same extent as that of Embodiment I-1.

Thereafter, by the same procedures as explained in Embodiment I-1, the resist film 5 is formed on the mask 4 and the resist pattern 6 is formed. Then, the working of the mask 4 and the working film was performed in the same manner as in the case of Embodiment I-1, and the etch bias in the working and the etching selectivity ratio thereof were investigated. The masks employed in this embodiment were excellent in etching resistance which was comparable to that of Embodiment I-1, so that it was possible to work the working film with excellent dimensional controllability.

Further, this working film pattern was transcribed onto this $SiO_2$ film to form an $SiO_2$ film pattern. According to this embodiment, since it was possible to suppress the etch bias on the occasion of transcribing the mask pattern onto the working film pattern, it was possible to obtain an $SiO_2$ film pattern with excellent controllability. It is possible, in this manner, to transcribe the working film pattern onto a thin film which is located further below.

(Embodiment II)

Next, this embodiment will be explained with reference to FIGS. 2A through 2F.

First of all, an interlayer insulating film as a working film 103 for example was formed, through a metallic wiring layer 102, on the surface of a silicon substrate 101 having element regions (not shown) formed therein.

As for the material for the working film 103, there is not any particular limitation. It is possible to employ, for example, an insulating material; a conductive material such as aluminum (Al), aluminum silicide (AlSi), copper (Cu), tungsten (W), tungsten silicide (WSi), titanium (Ti), titanium nitride (TiN), etc.; and a semiconductor material such as germanium (Ge), silicon (Si), etc. As for the insulating material, it is possible to employ silicon oxide (SiO), silicon nitride (SiN), silicon oxynitride (SiON), in addition to organic materials, organic resins, etc.

In the course of forming a pattern in the working film 103, the etching step for forming the pattern is performed by using the pattern of the mask to be formed on the surface of the working film. On the other hand, the pattern of the mask is formed, according to a known method, by the transcription of the pattern formed in a film to be formed over the mask. Therefore as explained below, when a pattern is to be formed on the surface of the working film 103, the pattern is successively transcribed, by dry etching for instance, from an upper layer via the mask to the working film 103 which is located below the upper layer.

In this embodiment, a mask positioned at an interface between an upper film and a lower working film in the course of forming a pattern in the working film 103 is defined as being an intermediate film. Namely, the intermediate film is a film capable of functioning as a direct masking material in the course of forming a pattern in the working film 103.

In this embodiment, the intermediate film functioning as a mask comprises a compound having a semiconductor element-oxygen linkage or a metallic element-oxygen linkage in the main chain thereof. When an energy beam is irradiated onto this intermediate film, the etching resistance of this intermediate film can be enhanced. In particular, when the working film 103 is constituted by an organic material, it can be suitably employed as the mask.

In a case where the working film 103 is constituted by an organic material, this working film can be employed as an underlying resist to be employed in a multi-layer resist system, or as a low dielectric insulating film for instance. Specifically, the working film 103 can be constituted by an organic material containing carbon atom such as novolac, polyvinyl phenol, polymethacrylate, polyarylene, polyimide, and polyarylene ether, etc.

In this case, the content of carbon in these organic materials should preferably be 10% by weight or more. Because, if the content of carbon is less than 10% by weight, the etching selectivity thereof relative to the intermediate film (=a difference in etching rate) on the occasion of etching step would become insufficient. As for the film thickness of the working film, although it may differ depending on the end-use, but it should preferably be within the range of about 20 nm to 10,000 nm. Because, if the thickness of the working film is less than 20 nm, it may become difficult to expect the effect of the working film. On the other hand, if the thickness of the working film exceeds over 10,000 nm, a etch bias would be prominently generated in the working film on the occasion of transcribing an intermediate film pattern to the working film.

In this embodiment, a thin film may be interposed at an interface between the substrate wherein elements are formed and the working film. The thin film to be formed in this case may be constituted by an interlayer insulating film comprising for example of $SiO_2$, wherein the working film is employed as an lower resist in a multi-layer resist process. Namely, when the working film pattern formed as mentioned above is employed as an lower resist in a multi-layer resist process, the interlayer insulating film underlying the lower resist can be worked with excellent dimensional controllability.

FIGS. 2A to 2F respectively shows a cross-sectional view showing each pattern parallel in the longitudinal direction thereof.

First of all, a metallic wiring layer 102 is formed via a predetermined insulating film (not shown) on the surface of a silicon substrate 101 having element regions (not shown) formed therein. Then, an interlayer insulating film is formed as a working film 103 on the surface of the metallic wiring layer 102.

Figure 2A:
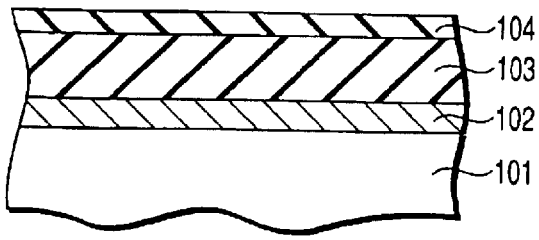
FIGS. 2A to 2F respectively shows a cross-sectional view illustrating in step-wise the process of forming a pattern according to another embodiment of the present invention.

An intermediate film 104 to be functioned as a mask is formed on the surface of the working film 103 to obtain a laminate structure as shown in FIG. 2A.

Where the thickness of the working film 103 is within the range of 20 nm to 10,000 nm, the thickness of the intermediate film 104 should preferably be within the range of 5 nm to 5,000 nm. If the thickness of the intermediate film 104 is less than 5 nm, the intermediate film 104 functioning as a mask is consumed up during the etching process of the working film 103, so that it may become difficult to work the working film 103 into predetermined dimension and configuration. On the other hand, if the thickness of the intermediate film 104 exceeds over 5,000 nm, a dimensional etch bias would be prominently generated in the intermediate film 104 on the occasion of transcribing an upper resist pattern onto the intermediate film pattern 104.

Preferably, this intermediate film 104 should be formed by a coating method. Because the coating method is relatively simple in process such as the setting of conditions, the number of steps, and the time required for performing the coating as compared with a CVD (Chemical Vapor Deposition) method, so that the cost involved in the process can be minimized.

Next, the procedures for forming the intermediate film 104 functioning as the mask will be explained in detail.

First of all, an oxygen-containing compound having a semiconductor element-oxygen linkage or a metallic element-oxygen linkage in the main chain thereof is dissolved in a solvent to prepare a solution which can be employed for forming the intermediate film 104.

As for the semiconductor element to be employed in this case, it is possible to employ germanium (Ge), silicon (Si), etc. As for the metallic element to be employed in this case, it is possible to employ aluminum (Al), titanium (Ti), germanium (Ge), zirconium (Zr), tungsten (W), etc.

In a case where silicon (Si) is to be employed as a semiconductor material, the material for the intermediate film 104 should preferably be prepared from a compound containing silicon (Si) as a semiconductor element. Because if a semiconductor element other than silicon (Si) or a metallic element is employed, it may give rise to the problem of contamination in the process of manufacturing a semiconductor device.

As for specific examples of the oxygen-containing compound, the compounds represented by the following chemical formulas (11-1) through (12-8) for instance can be employed.

(11-1)

(11-2)

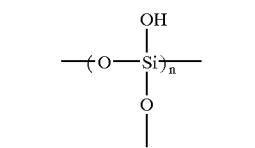
(11-3)

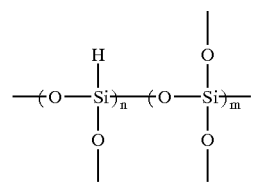
(11-4)

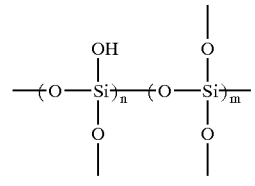
(11-5)

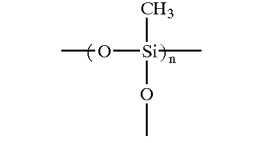
(11-6)

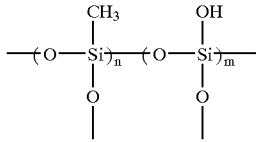
(11-7)

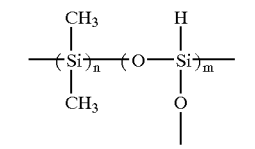

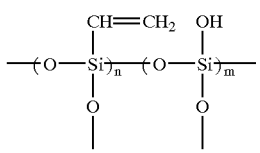

-continued (12-1)

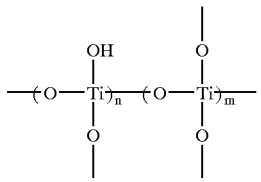

(12-2)

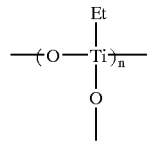

(12-3)

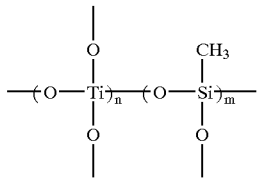

(12-4)

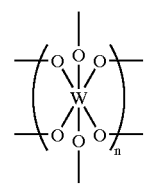

(12-5)

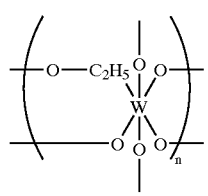

(12-6)

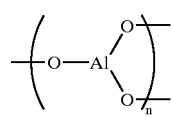

(12-7)

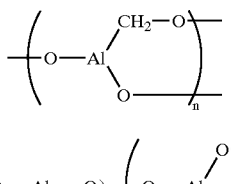

(12-8)

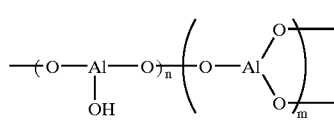

Figure 2D:
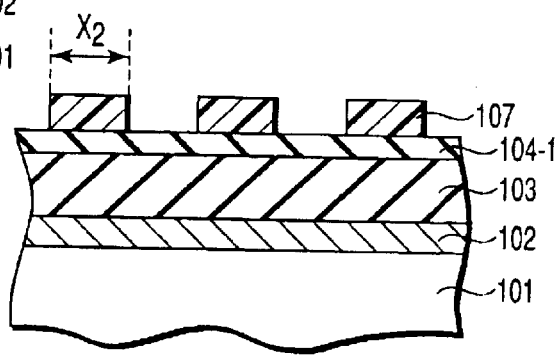
Figure 2B:
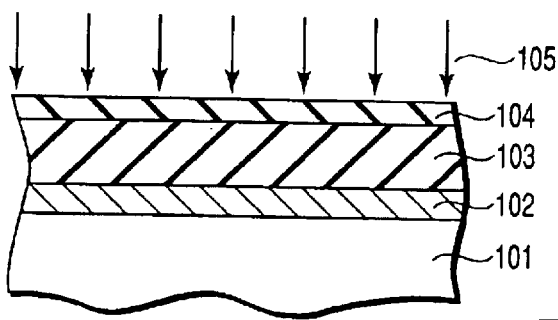

As shown in the aforementioned chemical formulas, the semiconductor element or the metallic element should preferably be such that hydrogen atom, hydroxyl group or a functional group containing carbon is bonded thereto as a substituent group. These groups would be dissociated as they are irradiated with an energy beam 105 in a subsequent step as shown in FIG. 2B. As a result, the intermediate film 104 is enabled to enhance the densification and oxidation thereof, thus improving the etching resistance thereof as a mask. Further, the substituent group is formed of hydroxyl group, the hydroxyl group can be dehydrocondensed by the irradiation of the energy beam 105. As a result, the intermediate film 104 can be densified, thus improving the etching resistance thereof as a mask.

As for the molecular weight of the aforementioned oxygen-containing compound, although there is not any particular limitation, it would be preferable that the molecular weight is confined within the range of 100 to 100,000. If the molecular weight of the oxygen-containing compound is less than 100, the oxygen-containing compound is likely to be sublimed in a step of baking treatment after it is coated on the surface of the silicon substrate 101. On the other hand, if the molecular weight of the oxygen-containing compound exceeds over 100,000, it cannot be sufficiently dissolved in a solvent, thus making it difficult to prepare a solution thereof.

A solution to be employed for forming the intermediate film 104 may further contain a compound which is capable of absorbing the energy beam 105. If such a compound is incorporated into the solution, the energy beam 105 can be absorbed by the intermediate film 104 in the step of irradiating the energy beam as shown in FIG. 2B, thus heating the intermediate film 104 up to a high temperature and thereby densifying the intermediate film 104.

As for the means for irradiating the energy beam 105, it is preferable to employ a flash lamp. Because the flash lamp is high in irradiation intensity, so that the densification or oxidation of the intermediate film 104 as a mask can be promoted.

In this case, the compound which is capable of absorbing the energy beam 105 is required to be selected from compounds which are capable of absorbing light in the output wavelength zone (=300 nm to 700 nm) of the flash lamp. Examples of such a compound include a dye such as coumalin, curcumin, etc.; a photosensitive agent such as diazonaphthoquinone; and a polymer such as polysulfone, polyimide, polysilane, etc.

The compound capable of absorbing the energy beam may be identical with the aforementioned oxygen-containing compound. For example, a compound having a semiconductor element-oxygen linkage in the main chain thereof or a compound having a metallic element-oxygen linkage in the main chain thereof may be identical with the compound which is capable of absorbing the energy beam. Alternatively, the aforementioned oxygen-containing compound and the compound capable of absorbing the energy beam may be co-polymerized with each other. Further, the oxygen-containing compound may be a compound wherein a substituent group which is capable of absorbing the energy beam is bonded to a side chain of the oxygen-containing compound. Examples of such a compound include, for example, the compounds represented by the aforementioned chemical formulas (11-6), (11-7), and (12-1) to (12-5), if the energy beam is to be irradiated by using a flash lamp.

A solution to be employed for forming the intermediate film 104 may further contain, if required, a thermopolymerization inhibitor in order to improve the storage stability of the solution. Furthermore, a solution for forming the intermediate film 104 may further contain an adhesion improver for enhancing the adhesion of the intermediate film 104 to a working film, an electrically conductive material, a substance which is capable of generating electric conductivity as it is exposed to light or heat, or a surfactant for improving the coatability of the solution.

As for the solvent useful in this case, there is not any particular limitation. For example, it is possible to employ a ketone type solvent such as acetone, methylethyl ketone, methylisobutyl ketone and cyclohexanone; a Cellosolve type solvent such as methyl Cellosolve, methyl Cellosolve acetate and ethyl Cellosolve acetate; an ester type solvent such as ethyl lactate, ethyl acetate, butyl acetate and isoamyl acetate; an alcoholic solvent such as methanol, ethanol and isopropanol; anisole; toluene; xylene; naphtha; water; etc.

A solution to be employed for forming the intermediate film 104 prepared according to the aforementioned method is then coated on the surface of the working film 103 by spin-coating for instance, and then heat-treated allowing a solvent to evaporate, thus forming the intermediate film 104 on the surface of the working film 103. Although there is not any particular limitation with respect to the temperature to be employed in this heat treatment, it is preferable to confine this heating temperature within the range of 100 to 500° C. Because, if this heating temperature is lower than 100° C., it would become difficult to sufficiently evaporate the solvent from the coated film. On the other hand, if this heating temperature is higher than 500° C., the working film 103 may be denatured due to the effects of heat.

The content of the semiconductor element or the metallic element which is contained in the intermediate film 104 after this heat treatment should preferably be confined within the range of 5 to 98% by weight based on 100% by weight of the solid matters of the intermediate film 104. Because, if the content of the semiconductor element or the metallic element is less than 5% by weight, it will lead to an excessive inclusion of organic components in the intermediate film 104. Therefore, even if the energy beam 104 is irradiated onto the intermediate film 104 in the step shown in FIG. 2B, it would become difficult to sufficiently evaporate the substituent groups included therein. On the other hand, if the content of the semiconductor element or the metallic element is more than 98% by weight, it would become impossible to sufficiently dissolve the oxygen-containing compound in a solvent, thereby deteriorating the coating performance of the solution. As a result, it would become difficult to coat the intermediate film 104 having a uniform thickness on the surface of the working film 103.

Then, as shown in FIG. 2B, the energy beam 105 is irradiated onto the intermediate film 104. Since the substituent group contained in the intermediate film 104 is liable to be decomposed, the inclusion of the substituent group would lead to the deterioration in etching resistance of the intermediate film 104, if the intermediate film 104 is employed as a mask on the occasion of etching the working film 103. However, this substituent group can be dissociated by the irradiation of the energy beam 105, thereby promoting the oxidation of the intermediate film 104. As a result, the intermediate film 104 can be modified into a film of high density, thus making it possible to enhance the etching resistance thereof as it is used as a mask.

As for the energy beam 105 to be irradiated onto the intermediate film 104, it is possible to utilize a light beam or an electron beam. As for the light beam, it is preferable to employ a light beam having a wavelength ranging from 100 nm to 700 nm. Although there is not any particular limitation with respect to the exposure dose of light and electron beam, the exposure dose should preferably be confined within the range of 1 mJ/cm$^2$ to 100 J/cm$^2$ if light beam is to be employed, or within the range of 1 $\mu$C/cm$^2$ to 100 C/cm$^2$ if electron beam is to be employed. In either cases, if the exposure dose is less than the aforementioned lower limit, it would become difficult to sufficiently proceed the oxidation. On the other hand, if the exposure dose is higher than the aforementioned upper limit, it would take a long time for the substitution reaction, thus leading to the deterioration of throughput.

The irradiation of the energy beam 105 to the intermediate film 104 may be performed while heating the silicon substrate 101. If the irradiation of the energy beam is performed in this manner, the densification of the intermediate film 104 can be achieved by employing an energy beam which is relatively low in energy and also low in exposure dose.

Figure 2E:
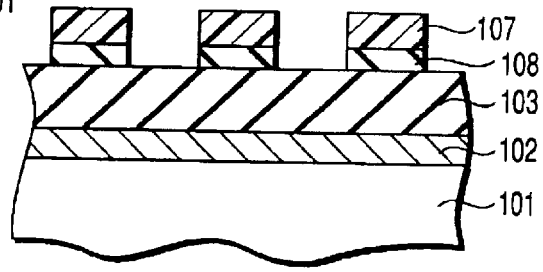
Figure 2C:
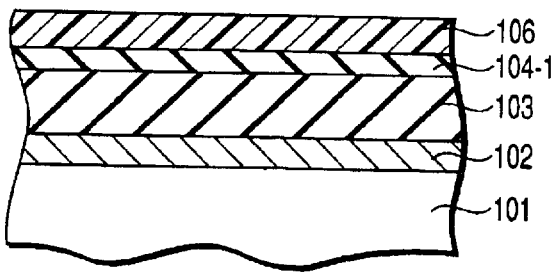

On the resultant intermediate film 104-1 which has been densified through the irradiation of energy beam, a solution of resist is coated and then heat-treated to form a resist film 106 as shown in FIG. 2C.

It is possible, by thinning the film thickness of the resist film 106, to proportionally enhance the tolerance in quantity of exposure, focusing tolerance or the resolution at the moment of exposure. Therefore, the film thickness of the resist film 106 should be as thin as possible so long as the intermediate film 104 can be etched with excellent dimensional controllability. More specifically, the film thickness of the resist film 106 should preferably be within the range of 100 to 10,000 nm, provided that the film thickness of the intermediate film 104 is within the range of 20 to 5,000 nm.

As for the kinds of the resist, and therefore, the resist may be either negative or positive in type, that can be selected depending on the end-use thereof. In the preparation of a solution of resist, the materials shown below can be employed for forming a resist film.

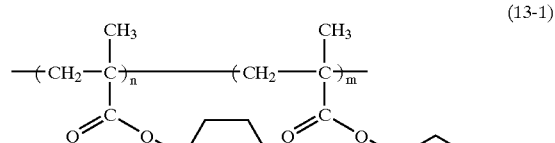

(13-1)

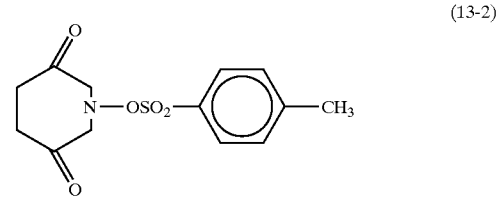

(13-2)

As for specific examples of such a positive resist, it is possible to employ a resist composition comprising naphthoquinone diazide and novolak resin (IX-770, JSR Co.); and a chemical amplification type resist composition comprising polyvinylphenol resin protected by t-BOC and an acid-generating agent (APEX-E, Shipley Co.). As for specific examples of such a negative resist, it is possible to employ a chemical amplification type resist comprising is polyvinylphenol, melamine resin and a photo-acid generating agent (SNR200, Shipley Co.), and a resist comprising polyvinyiphenol and a bisazide compound (RD-2000N, Hitachi Kasei Co., Ltd.). It should be noted that the resist useful in this invention is not confined to these compositions.

A solution of any one of these resist compositions is coated on the intermediate film 104 by a spin coating method, a dipping method, etc. and then heat-treated to evaporate the solvent to form the resist film 106.

Then, a patterning exposure is performed on the resist film 106 through an exposure mask (reticle).

As for the light source for the exposure light, it may be g-ray (wavelength=436 nm) or i-ray (wavelength=365 nm) of a mercury lamp; an excimer laser such as XeF (wavelength=351 nm), XeCl (wavelength=308 nm), KrF (wavelength=248 nm), KrCl (wavelength=222 nm), ArF (wavelength=193 nm), $F_2$ (wavelength=157 nm); X-ray; electron beam; ion beam; etc.

Upon finishing the exposure, the resultant resist film may be subjected to a post-exposure baking, if required. Thereafter, the resist film is subjected to a developing treatment using an alkaline developing solution such as TMAH, choline, etc., thereby forming a resist pattern 107 as shown in FIG. 2C.

Then, by an etching method, the resist pattern 107 is transcribed to the intermediate film 104 to form an intermediate film pattern 108 as shown in FIG. 2E.

As for the etching method, there is not any particular limitation as long as it is capable of performing the fine working of the intermediate film 104. For example, it is possible to employ a wet etching method or a dry etching method. As for the dry etching method, it is possible to employ a reactive ion etching, a magnetron type reactive ion etching, an electron beam ion etching, an ICP etching and an ECR ion etching. If a dry etching method is to be employed, it is preferable to employ a source gas containing fluorine atom (F) in view of the advantage thereof that the intermediate film 104 can be worked with excellent dimensional accuracy.

Figure 2F:
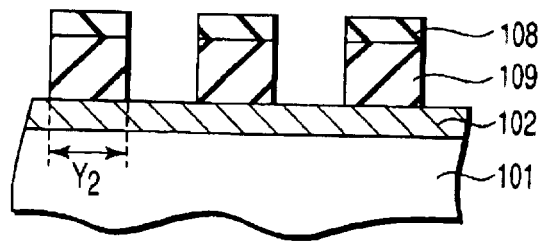

Then, the intermediate film pattern 108 thus obtained is transcribed onto the working film 103 by a dry etching method to form a working film pattern 109 as shown in FIG. 2F.

As for the dry etching method, there is not any particular limitation as long as it is capable of performing the fine working of the working film 103. For example, it is possible to employ a reactive ion etching, a magnetron type reactive ion etching, an electron beam ion etching, an ICP etching and an ECR ion etching. As for the source gas, it is preferably to employ a gas containing at least one kind of material selected from the group consisting of oxygen atom (O), nitrogen atom (N), chlorine atom (Cl) and bromine atom (Br). Since a compound having an inorganic element-oxygen linkage is inert to an etchant to be generated through the discharging of a gas containing any of these atoms, the compound is very effective as an intermediate film.

In particular, since the intermediate film is highly densified by the irradiation of an energy beam, the etching resistance thereof is further improved, so that the working film 103 can be etch-worked excellent in anisotropy. As for the etching gas containing oxygen atom, it is possible to employ $O_2$, CO, $CO_2$, etc. As for the etching gas containing nitrogen atom, it is possible to employ $N_2$, $NH_3$, etc. As for the etching gas containing chlorine atom, it is possible to employ $Cl_2$, HCl, $BCl_3$, etc. As for the etching gas containing bromine atom, it is possible to employ HBr, $Br_2$, etc. These gases may be mixed together for use. Further, any of these gases may contain sulfur atom (S). If sulfur atom is included in these gases, the working film can be worked excellent in anisotropy. Additionally, any of these etching gases may contain argon (Ar), helium (He).

In the foregoing explanation of this embodiment, this intermediate film 104 is densified through the irradiation of an energy beam prior to the coating step of the resist film 106 on the surface of this intermediate film 104. However, the step of irradiating an energy beam may be performed at any moment as long as the irradiation is performed before the intermediate film pattern is transcribed onto the working film. Therefore, the irradiation of an energy beam can be performed in such a manner that the energy beam can be effected on the intermediate film after the intermediate film pattern has been formed. Alternatively, the irradiation of an energy beam can be performed in such a manner that the energy beam can be effected on the intermediate film functioning as a mask after the resist film has been coated or after the resist pattern has been formed.

(Embodiment II-1)

This embodiment will be explained with reference to FIGS. 2A to 2F.

First of all, a metallic wiring layer 102 comprising a laminate structure (=Ti/Al/Ti=10 nm/480 nm/10 nm), 180 nm in line width and 360 nm in space width, was formed over the surface of a silicon substrate 101 having element regions (not shown) formed therein.

An interlayer insulating film functioning as a working film 103 was deposited over the metallic wiring layer 102.

For use as a material for the working film 103, 10 g of polyarylene ether was dissolved in 90 g of cyclohexanone to prepare a solution. Then, this solution was spin-coated on the surface of the silicon substrate 101, and the resultant silicon substrate 101 was placed on a hot plate to perform a baking treatment for 2 minutes at a temperature of 350° C. to form the interlayer insulating film having a thickness of 700 nm and functioning as a working film 103.

Next, by a spin-coating method or a coating method, an intermediate film 104 functioning as a mask was formed on the surface of the working film 103 as shown in FIG. 2A.

In this embodiment, the intermediate film 104 functioning as a mask was formed by following the procedures (SS1) to (SS3) shown below.

(SS1) 10 g of the compound represented by the aforementioned chemical formula (11-7) (copolymerization ratio: n/m=1/7) and employed as an oxygen-containing compound was mixed with 90 g of cyclohexanone to prepare a solution to be formed into the intermediate film 104. This solution was then spin-coated on the surface of the working film 103 to form a coated film. This coated film was subjected to baking treatment in air atmosphere at a temperature of 180° C. for 60 seconds to allow the solvent to evaporate, and then, to additional baking treatment in air atmosphere at a temperature of 300° C. for 120 seconds, thereby forming the intermediate film 104.

(SS2) 8 g of the compound represented by the aforementioned chemical formula (11-1), and 2 g of the compound represented by the aforementioned chemical formula (11-6) (copolymerization ratio: n/m-1/1), both being employed as an oxygen-containing compound, were mixed with 90 g of cyclohexanone to prepare a solution. This solution was employed in the same manner as in the aforementioned method (SS1), thereby forming the intermediate film 104.

(SS3) 10 g of the compound represented by the aforementioned chemical formula (12-1) was mixed with 90 g of cyclohexanone to prepare a solution. This solution was employed in the same manner as in the aforementioned method (SS1), thereby forming the intermediate film 104.

Then, as shown in FIG. 2B, an energy beam 105 was irradiated onto the intermediate film 104 prepared as described above and to be functioned as a mask. In this case, a flash lamp was employed for the energy beam 105, and the irradiation to the intermediate film 104 was performed at an exposure dose of 10 J/cm².

Due to the irradiation of the flash lamp, the intermediate film 104 formed as a mask was densified in texture and turned into an intermediate film 104-1 as shown in FIG. 2C.

Then, the measurement of absorbency at an peak output wavelength zone of the flash lamp (=400 nm) was performed on each of the intermediate films that had been formed by the aforementioned methods (SS1) to (SS3). Furthermore, the fluctuations in components and in density of each of the intermediate films before and after the irradiation of the flash lamp beam employed as the energy beam 105 were investigated. The results are shown in Table 4 shown below.

TABLE 4

|  | Absorbency | Before irradiated with energy beam | | | After irradiated with energy beam | | |
| --- | --- | --- | --- | --- | --- | --- | --- |
|  |  | O/Si (O/Ti) | C/Si (C/Ti) | Density (g/cm³) | O/Si (O/Ti) | C/Si (C/Ti) | Density (g/cm³) |
| Film of (SS1) | 2.2 | 1.72 | 0.90 | 1.89 | 1.92 | 0.12 | 2.10 |
| Film of (SS2) | 1.8 | 1.68 | 0.82 | 1.78 | 1.97 | 0.14 | 2.12 |
| Film of (SS3) | 4.2 | 1.68 | 0.89 | 1.92 | 1.98 | 0.20 | 2.20 |

As shown in Table 4, each of the intermediate films that had been formed by the methods (SS1) to (SS3) were found high in the degree of absorbing the beam of flash lamp, i.e. the absorbency.

Thereafter, the elemental analysis of each of the intermediate films were performed before and after the irradiation of the beam of flash lamp to determine the ratio of the content between oxygen (O) and silicon (Si) (or between oxygen (O) and titanium (Ti)) and between carbon (C) and silicon (Si) (or between carbon (C) and titanium (Ti)). As a result, the decrease in the ratio of carbon component and the increase in the ratio of oxygen component were confirmed. Namely, the organic component was decreased, thus indicating an increased oxidation.

Further, it will be understood from the results of the measurement of the density of each intermediate film that due to the irradiation by the beam from the flash lamp, the film quality of every intermediate film was improved in density. This can be attributed to the fact that due to the absorption of the beam of the flash lamp, the intermediate films were heated up to a high temperature.

By the way, the deformation or denaturing of the metallic wiring layer 102 after the irradiation of the beam of the flash lamp was not recognized at all.

Then, 9 g of a dissolution inhibitor (average molecular weight: 12,000) represented by the aforementioned chemical formula (13-1), and 1 g of an acid-generating agent represented by the aforementioned chemical formula (13-2) were dissolved in 90 g of ethyl lactate to prepare a solution of resist. Then, this resist solution was coated on the surface of the intermediate film 104-1 to be functioned as a mask by spin-coating, and the resultant layer was subjected to a baking treatment at a temperature of 140° C. for 90 seconds by using a hot plate, thereby obtaining a resist film 106 having a thickness of 200 nm as shown in FIG. 2C.

Then, the resist film 106 was subjected to a patterning exposure using as a light source an ArF excimer laser and through an exposure mask (=reticle), followed by a baking treatment at a temperature of 140° C. for 90 seconds. The resultant resist film 106 was then subjected to a developing treatment using a 0.21N tetrahydroxy ammonium solution to form a resist pattern 107 having a 110 nm line-and-space pattern as shown in FIG. 2D. The resist pattern 107 is transcribed onto the intermediate film pattern 104-1 to be functioned as a mask by a dry etching method. Namely, a pattern is formed on the intermediate film 104-1 according to the dimension and the configuration of the resist pattern 107. In this case, the dimension of the bottom of the resist pattern 107 was defined as $X_2$ as shown in FIG. 2D.

Then, by a dry etching method, the resist pattern 107 was transcribed onto the intermediate film 104-1 to form an intermediate film pattern 108 (=mask pattern) as shown in FIG. 2E. As a result, the dimension $X_2$ of the bottom of the resist pattern 107 was accurately transcribed onto the intermediate film pattern 108.

In this case, a magnetron type reactive ion etching apparatus was employed as an etching apparatus, and the etching was performed under the conditions wherein a $CF_4/O_2/Ar$ gas (flow rate: 20 sccm/100 sccm/200 sccm) was employed as a source gas, the vacuum degree in the reaction chamber was set to 75 mTorr, the exciting power density was set to 1.3 W/cm$^2$, and the temperature of silicon substrate was set to 40° C.

It was possible, in all of cases where the intermediate film was formed by any one of the methods of (SS1) to (SS3), to form an intermediate film pattern 108 with excellent anisotropy.

Then, by a dry etching method, the intermediate film pattern 108 was transcribed onto the working film 103 to form a working film pattern 109 as shown in FIG. 2F.

In this case, a magnetron type reactive ion etching apparatus was employed as an etching apparatus, and the etching was performed under the conditions wherein a $N_2/O_2$ gas (flow rate: 20 sccm/100 sccm) was employed as a source gas, the vacuum degree in the reaction chamber was set to 75 mTorr, the exciting power density was set to 1.3 W/cm$^2$, and the temperature of silicon substrate was set to 40° C.

The dimensional etch bias generated due to the etching of working film 103 was defined as follows and summarized in Table 5. Namely, the dimensional etch bias herein was defined as being a difference between the dimension $Y_2$ of the bottom of the working film pattern 109 after the etching as shown in FIG. 2F and the dimension $X_2$ of the bottom of the resist pattern 107 shown in FIG. 2D (i.e. the etch bias=$Y_2-X_2$).

The results are shown in the following Table 5 wherein this embodiment was shown in comparison with the cases where the beam of flash lamp, i.e. the energy beam 105, was not irradiated.

TABLE 5

| | Not irradiated with energy beam | | Irradiated with energy beam | |
|---|---|---|---|---|
| | Etch bias (nm) | Etching rate (nm/min.) | Etch bias (nm) | Etching rate (nm/min.) |
| Film of (SS1) | +13.0 | 21.2 | +2.5 | 6.3 |
| Film of (SS2) | +12.2 | 22.4 | +3.5 | 5.7 |
| Film of (SS3) | +14.3 | 23.2 | +2.8 | 6.0 |

As shown in Table 5, in all of the cases where the intermediate films that had been formed by the methods (SS1) to (SS3), the dimensional etch bias in the interlayer insulating working film in the step etching work were found falling within the permissible range (=±5 nm), thus indicating that the working film pattern 109 was formed with excellent dimensional controllability.

Table 5 also shows the results measured of the etching rate of each of the intermediate films. When the beam of the flash lamp was employed as the energy beam 105, the etching rate of each of the intermediate films was deteriorated as compared with that where the irradiation was not performed. As compared with the etching rate of the working film 103 (=320 nm/min), the etching rate of the intermediate film was far smaller, thereby indicating a sufficient etching resistance of the intermediate film as a masking material in the step of forming a pattern in the working film 103. As a result, it was considered possible to form the working film pattern 103 with excellent dimensional controllability.

(Comparative Embodiment II-1)

In this comparative embodiment, each of the intermediate films that had been formed by the methods (SS1) to (SS3) shown in Embodiment II-1 was annealed by heating it at a temperature of 800° C. for one hour by using a lamp-annealing apparatus. Then, each of the intermediate films was measured with respect to the composition ratio of elements and the density thereof before and after the annealing, the results being shown in the following Table 6.

TABLE 6

| | O/Si (O/Ti) | C/Si (C/Ti) | Density (g/cm$^3$) | Etch bias (nm) | Etching rate (nm/min.) |
|---|---|---|---|---|---|
| Film of (SS1) | 1.93 | 0.11 | 2.08 | +3.5 | 7.0 |
| Film of (SS2) | 1.96 | 0.13 | 2.09 | +4.5 | 6.2 |
| Film of (SS3) | 1.97 | 0.19 | 2.19 | +3.8 | 6.5 |

It will be seen from the comparison between the results shown in Table 6 and the results shown in Table 5 that when the beam of flash lamp was irradiated (Embodiment II-1), the composition ratio of elements of each intermediate film was comparable with the composition ratio of elements of the intermediate film of this comparative embodiment. Therefore, it will be admitted from this fact that when the beam of flash lamp is irradiated as in Embodiment II-1, the oxidation and densification would take place in the intermediate film to almost the same degree as the case where the annealing is performed using a heating treatment. Therefore, it will be seen from this comparative embodiment also that the irradiation of the beam of flash lamp is capable of giving almost the same effect as obtainable in an annealing treatment by heating.

In the same manner as in Embodiment II-1, the dimensional etch bias of the working film 103 and the etching rate of each intermediate film were measured, the results thereof being shown in the above Table 6. The intermediate films which had been thermally annealed were found having almost the same degree of etching resistance as that of each intermediate film employed in Embodiment II-2, and the dimensional etch bias was also found falling within the permissible range (±5 nm).

In the case where this comparative embodiment is employed, since the metallic wiring layer 102 disposed immediately below the working film 103 is exposed to a temperature of as high as 800° C., the metallic wiring layer 102 is likely to be denatured and deformed. Further, when the heat treatment is performed at a high temperature as in the case of this comparative embodiment, the material disposed over a silicon substrate is badly affected by the heating, thereby possibly inviting the denaturing or deforming thereof even though the intermediate film can be effectively densified.

In the pattern-forming method shown in the aforementioned Embodiment II-1, only the intermediate film 104 to be functioned as a mask is permitted to selectively absorb the beam of flash lamp and hence to increase the temperature thereof. As a result, it is possible to avoid the problem that a silicon substrate as well as other materials deposited over the silicon substrate are denatured or deformed.

(Comparative Embodiment II-2)

In this comparative embodiment, the characteristics of the intermediate film 104 which has not been irradiated with the beam of flash lamp as an energy beam will be discussed.

Additionally, each of the intermediate films that had been formed by the methods (SS1) to (SS3) as shown in Embodiment II-1 will be also discussed with reference to Tables 4 and 5.

As shown in Table 4, the density of the intermediate film prior to the irradiation of energy beam is lower than that of the intermediate film that had undergone the irradiation of energy beam, thus indicating that the intermediate film 104 was not sufficiently densified in quality.

Table 5 shows the results measured of the etching rate of each intermediate film on which the energy beam was not yet irradiated and the dimensional etch bias of the working film 103. It will be seen from the results that when the energy beam was not irradiated, the etching rate of the intermediate film was increased as compared with the intermediate film which had undergone the irradiation of the energy beam, thus indicating a poor etching resistance of the intermediate film. Further, the dimensional etch bias of the working film 103 was also exceeded well over the permissible range (±5 nm).

The reason for this poor etching resistance can be attributed to the fact that when the irradiation of energy beam was not applied to the intermediate film, the density of the film was relatively low as compared with the density of the intermediate film onto which the irradiation of energy beam had been applied, thus failing to sufficiently densify the intermediate film.

(Comparative Embodiment II-3)

In this comparative embodiment, as the intermediate film, a film which was formed by LPCVD (=Low Pressure CVD) method, i.e. an intermediate film (RR) was employed. Specifically, an $SiO_2$ film which was formed by LPCVD method was employed as one example of this intermediate film (RR).

Table 7 shows the results measured of the absorbency of the intermediate film (RR) which was irradiated with a beam of flash lamp as an energy beam, and of the composition ratio of elements and the density thereof before and after the irradiation using a beam of flash lamp.

As shown in Table 7, when the absorption spectrum of the intermediate film (RR) (e.g. $SiO_2$ film) was measured, the absorption of light was not recognized in the output wavelength zone of the flash lamp (=300 nm to 600 nm).

As shown in FIG. 7, when the measurement was performed before and after the irradiation using a beam of flash lamp, any substantial fluctuation was not recognized with regard to the composition ratio of elements and density of the intermediate film (RR).

The reason for this can be attributed to the fact that the intermediate film (RR) (e.g. $SiO_2$ film) of this comparative embodiment was incapable of absorbing light in the output wavelength zone of the flash lamp, and hence was not sufficiently heated up.

Table 8 shows the results measured of the etching rate of each intermediate film and the dimensional etch bias of the working film 103, the results being classified into two groups, i.e. one group wherein the irradiation using a beam of flash lamp was performed, the other wherein the irradiation using a beam of flash lamp was not performed. However, as shown in Table 7, since the intermediate film (RR) did not exhibit any substantial fluctuation before and after the irradiation of an energy beam, the results where the energy beam was not irradiated are shown.

TABLE 8

|  | Not irradiated with energy beam | | Irradiated with energy beam | |
| --- | --- | --- | --- | --- |
|  | Etch bias (nm) | Etching rate (nm/min.) | Etch bias (nm) | Etching rate (nm/min.) |
| Film of (SS1) | +13.0 | 21.2 | +2.5 | 6.3 |
| Film of (SS2) | +12.2 | 22.4 | +3.5 | 5.7 |
| Film of (SS3) | +14.3 | 23.2 | +2.8 | 6.0 |
| Film of (RR) | +3.2 | 6.0 | — | — |

As shown in Table 8, it will be recognized, through the comparison between the intermediate film (RR) of this comparative embodiment and the intermediate films that had been formed by the methods (SS1) to (SS3) of Embodiment II-1, that during the etching step of the working film 103, the etching rates of these intermediate films were substantially identical with each other, and the dimensional etch bias of the working film in each case was confined within the permissible range (±5 nm).

The intermediate film which was formed by any one of the methods shown in Embodiment II-1 exhibited almost the same degree of etching resistance as that of the intermediate film (RR) (e.g. $SiO_2$ film) which was formed by LPCVD method, and was capable of suppressing the dimensional etch bias of the working film 103. Therefore, the intermediate films formed by the methods shown in Embodiment II-1 were capable of obtaining almost the same degree of etching resistance as that of the film to be formed by the LPCVD method even if the intermediate films were formed by a coating method such an SOG film.

TABLE 7

|  |  | Before irradiated with energy beam | | | After irradiated with energy beam | | |
| --- | --- | --- | --- | --- | --- | --- | --- |
|  | Absorbency | O/Si (O/Ti) | C/Si (C/Ti) | Density (g/cm³) | O/Si (O/Ti) | C/Si (C/Ti) | Density (g/cm³) |
| Film of (RR) | 0 | 2.00 | 0 | 2.23 | 2.00 | 0 | 2.23 |

As explained above, it is possible, with the employment of the pattern-forming method of Embodiment II-1, to enhance the etching resistance of film without badly affecting the other components including a silicon substrate even if the film to be employed as an intermediate film functioning as a mask is formed by coating method such as an SOG film. Therefore, the working accuracy of a pattern to be formed in a working film can be enhanced.

(Embodiment II-2)

In the pattern-forming method of this embodiment, electron beam was employed as an energy beam for irradiating an intermediate film to be functioned as a mask.

Next, this embodiment will be explained with reference to FIGS. 2A to 2F.

First of all, in the same manner as in Embodiment II-1, a metallic wiring layer 102 and an interlayer insulating film (a working film 103) were successively formed on the surface of a silicon substrate 101 having element regions (not shown) formed therein. Thereafter, by following the procedures (SS4) shown below, an intermediate film 104 functioning as a mask was formed on the surface of the working film as shown in FIG. 2A.

(SS4) 8 g of the compound represented by the aforementioned chemical formula (11-1) employed as an oxygen-containing compound was mixed with 90 g of cyclohexanone to prepare a solution to be formed into the intermediate film 104. This solution was then spin-coated on the surface of the working film 103 to form a coated film. This coated film was subjected to baking treatment in air atmosphere at a temperature of 180° C. for 60 seconds to allow the solvent to evaporate, and then, to additional baking treatment in air atmosphere at a temperature of 300° C. for 120 seconds, thereby forming the intermediate4 film 104.

Then, as shown in FIG. 2B, an energy beam 105 was irradiated onto the intermediate film 104 functioning as a mask. In this case, an electron beam was employed for the energy beam 105, and the irradiation to the intermediate film 104 was performed at an accelerating voltage of 25 keV and at an exposure dose of 10 C/cm$^2$.

Due to the irradiation of the electron beam, the intermediate film 104 to be functioned as a mask was densified in texture and turned into an intermediate film 104-1 as shown in FIG. 2C.

Then, the composition ratios of elements of the intermediate film 104 to be functioned as a mask and the density thereof before and after the irradiation of the electron beam were measured. The results are shown in the following Table 9.

TABLE 9

| | Before irradiated with energy beam | | | After irradiated with energy beam | | |
|---|---|---|---|---|---|---|
| | O/Si (O/Ti) | C/Si (C/Ti) | Density (g/cm$^3$) | O/Si (O/Ti) | C/Si (C/Ti) | Density (g/cm$^3$) |
| Film of (SS4) | 1.95 | 0 | 1.94 | 1.99 | 0 | 2.10 |

As shown in Table 9, when the electron beam was irradiated onto the intermediate film 104 that had been formed by the method (SS4) as set forth in this embodiment, the density of the irradiated film was almost comparable with that of Embodiment II-1 shown in Table 4, thus indicating that, due to the irradiation of electron beam, the intermediate film 104 functioning as a mask was enhanced in density to almost the same degree as that of Embodiment II-1.

By the way, just like Embodiment II-1, the deformation or denaturing of the working film 103 and the metallic wiring layer 102 after the irradiation of the electron beam was not recognized at all.

Then, in the same manner as in Embodiment II-1, a resist film 106 was formed on the intermediate film 104 as shown in FIG. 2C. Then, in the same manner as in Embodiment II-1, the resist film 106 was subjected to a patterning exposure, to a baking treatment and to a developing treatment to form a resist pattern 107 as shown in FIG. 2D.

The resultant resist pattern 107 was then employed as a mask to etch the intermediate film 104 in the same manner as in Embodiment II-1 to form an intermediate film pattern 108 (=mask pattern) as shown in FIG. 2E. Further, the resultant intermediate film pattern 108 was then employed as a mask to etch the working film 103 in the same manner as in Embodiment II-1 to form a working film pattern 109 as shown in FIG. 2F.

Then, the etching rate of the intermediate film 104 formed by the method of (SS4) and the dimensional etch bias of the working film 103 were measured, while classifying the samples into two groups, i.e. one group wherein the irradiation of electron beam was performed, the other wherein the irradiation of electron beam was not performed. Table 10 shows the results measured.

TABLE 10

| | Not irradiated with energy beam | | Irradiated with energy beam | |
|---|---|---|---|---|
| | Etch bias (nm) | Etching rate (nm/min.) | Etch bias (nm) | Etching rate (nm/min.) |
| Film of (SS4) | +10.5 | 23.8 | +3.2 | 6.6 |

As shown in Table 10, the intermediate film 104 formed by the method of (SS4) exhibited almost the same degree of etching rate as those shown in Table 4 shown above. Namely, the intermediate film irradiated with the electron beam exhibited almost the same degree of etching rate as that of the intermediate film irradiated with the flash lamp. Further, the dimensional etch bias of the working film 103 was confined within the permissible range (±5 nm). Therefore, it will be recognized that the intermediate film formed by the method of (SS4) according to this embodiment was capable of exhibiting almost the same degree of etching resistance as that of each of the intermediate films which were formed by the methods shown in Embodiment II-1.

As described above, even when the intermediate film to be functioned as a mask is irradiated with an electron beam as an energy beam as in this embodiment, it is possible to obtain almost the same effects that can be obtained in Embodiment II-1.

(Comparative Embodiment II-4)

A working film pattern 109 was formed by repeating the same procedures as described in Embodiment II-1 except that the electron beam was not irradiated onto the intermediate film 104 to be functioned as a mask.

According to the procedures shown in Embodiment II-2, i.e. the method shown in the aforementioned (SS4), the intermediate film 104 was formed on a working film 103.

Then, the dimensional etch bias of the working film 103 and the etching rate of the intermediate film 104 were measured, while classifying the samples into two groups, i.e. one group wherein the irradiation of electron beam was performed, the other wherein the irradiation of electron beam was not performed. Table 11 shows the results measured. Further, the density of the intermediate film 104 was investigated before and after the irradiation of the electron beam, the results being shown in Table 12.

TABLE 11

|  | Not irradiated with energy beam | | Irradiated with energy beam | |
|---|---|---|---|---|
|  | Etch bias (nm) | Etching rate (nm/min.) | Etch bias (nm) | Etching rate (nm/min.) |
| Film of (SS4) | +10.5 | 23.8 | +3.2 | 6.6 |

TABLE 12

|  | Before irradiated with energy beam | | | After irradiated with energy beam | | |
|---|---|---|---|---|---|---|
|  | O/Si (O/Ti) | C/Si (C/Ti) | Density (g/cm$^3$) | O/Si (O/Ti) | C/Si (C/Ti) | Density (g/cm$^3$) |
| Film of (SS4) | 1.95 | 0 | 1.94 | 1.99 | 0 | 2.10 |

As shown in Table 11, when the irradiation of electron beam was not performed, the etching rate of the resultant intermediate film was larger than that (=6.6 nm/min) of the intermediate film formed by the method of (SS4), and hence the etching resistance thereof was poor. Furthermore, the dimensional etch bias of the working film 103 exceeded well over the permissible range (±5 nm).

The reason for the poor etching resistance of the intermediate film when it was not exposed to the irradiation of electron beam may be explained as follows. Namely, as shown in Table 12, the density of the non-irradiated intermediate film was relatively low as compared with the intermediate film which was exposed to the irradiation of electron beam, so that the non-irradiated intermediate film was not sufficiently densified.

As explained above, it will be seen that the irradiation of electron beam as an energy beam is effective in improving the etching resistance of the intermediate film to be employed as a mask.

(Embodiment II-3)

In this embodiment, a working film pattern was formed by repeating almost the same procedures as those of Embodiment II-2 except that ultraviolet ray was irradiated as an energy beam onto an intermediate film to be functioned as a mask.

Next, the method of forming a pattern according to this embodiment will be explained with reference to FIGS. 2A to 2F.

First of all, in the same manner as in Embodiment II-1, a metallic wiring layer 102 and an interlayer insulating film (a working film 103) were successively formed on the surface of a silicon substrate 101 having element regions (not shown) formed therein.

Thereafter, by following the procedures (SS5) or (SS6) shown below, an intermediate film 104 functioning as a mask was formed on the surface of the working film 103 as shown in FIG. 2A.

(SS5) 8 g of the compound represented by the aforementioned chemical formula (11-1) employed as an oxygen-containing compound was dissolved in 90 g of cyclohexanone to prepare a solution to be formed into the intermediate film 104. This solution was then spin-coated on the surface of the working film 103 to form a coated film. This coated film was subjected to baking treatment in air atmosphere at a temperature of 180° C. for 60 seconds to allow the solvent to evaporate, and then, to additional baking treatment in air atmosphere at a temperature of 300° C. for 120 seconds, thereby forming the intermediate film 104.

(SS6) The intermediate film 104 was formed by repeating the same procedures as those of (SS5) except that as an oxygen-containing compound, 8 g of the compound represented by the aforementioned chemical formula (11-2) was employed.

Then, as shown in FIG. 2B, an energy beam 105 was irradiated onto the intermediate film 104 functioning as a mask. In this case, ultraviolet ray beam (ArF excimer laser) was employed for the energy beam 105, and the irradiation to the intermediate film 104 was performed at an exposure dose of 10 J/cm$^2$.

The intermediate film formed according to any of the aforementioned methods (SS5) and (SS6) is capable of absorbing ultraviolet ray or of capable of being excited and reactive by the effect of ultraviolet ray. Therefore the employment of such a film is effective where ultraviolet ray such as ArF excimer laser is employed as an energy beam 105 as set forth in this embodiment.

Then, the composition ratios of elements of the intermediate film 104 and the density thereof before and after the irradiation of the electron beam were measured. The results are shown in the following Table 13.

TABLE 13

|  |  | Before irradiated with UV beam | | | After irradiated with UV beam | | |
|---|---|---|---|---|---|---|---|
|  | Absorbency | O/Si (O/Ti) | C/Si (C/Ti) | Density (g/cm$^3$) | O/Si (O/Ti) | C/Si (C/Ti) | Density (g/cm$^3$) |
| Film of (SS5) | 6.2 | 1.95 | 0 | 1.94 | 1.98 | 0 | 2.08 |
| Film of (SS6) | 0 | 1.92 | 0 | 1.92 | 1.99 | 0 | 1.98 |

As shown in Table 13, when the ultraviolet ray was irradiated onto the intermediate film 104 that had been formed by the method (SS5) or (SS6) as set forth in this embodiment, the irradiated film was densified almost in the same manner as that of Embodiment II-1.

Table 13 also shows the results measured of the absorbency of the film at 193 nm in wavelength of ArF excimer laser. While the intermediate film 104 formed by the method (SS5) was capable of absorbing the ultraviolet ray employed as an energy beam, the intermediate film 104 formed by the method (SS6) was incapable of absorbing the energy beam. Namely, in this embodiment, it is not necessarily required to employ a material which is capable of absorbing the ultraviolet ray for the formation of the intermediate film. Therefore, as in the case of the film of the method (SS6), it is possible to employ, for the formation of the intermediate film to be used as a mask, a material which is capable of being excited and reactive by the effect of an energy beam to make it possible to enhance the densification and oxidation of the film.

By the way, just like Embodiment II-1, the deformation or denaturing of the working film 103 and the metallic wiring layer 102 after the irradiation of the energy beam was not recognized at all.

Then, in the same manner as in Embodiment IT-1, a resist film 106 was formed on the intermediate film 104 (mask) as shown in FIG. 2C. Then, in the same manner as in Embodiment II-1, the resist film 106 was subjected to a patterning exposure, to a baking treatment and to a developing treatment to form a resist pattern 107 as shown in FIG. 2D.

The resultant resist pattern 107 was then employed as a mask to etch the intermediate film 104 in the same manner as in Embodiment II-1 to form an intermediate film pattern 108 (=mask pattern) as shown in FIG. 2E. Further, the resultant intermediate film pattern 108 was then employed as a mask to etch the working film 103 in the same manner as in Embodiment II-1 to form a working film pattern 109 as shown in FIG. 2F.

Then, the etching rate of the intermediate film 104 and the dimensional etch bias of the working film 103 were measured, while classifying the samples into two groups, i.e. one group wherein the irradiation of ultraviolet ray was performed in the etching step of the working film 103, the other wherein the irradiation of ultraviolet ray was not performed. Table 14 shows the results measured.

TABLE 14

| | Not irradiated with UV beam | | Irradiated with UV beam | |
|---|---|---|---|---|
| | Etch bias (nm) | Etching rate (nm/min.) | Etch bias (nm) | Etching rate (nm/min.) |
| Film of (SS5) | +10.5 | 20.8 | +2.2 | 6.0 |
| Film of (SS6) | +12.3 | 21.9 | +2.1 | 6.9 |

As shown in Table 14, the intermediate film 104 according to this embodiment exhibited almost the same degree of etching resistance as those of Embodiment II-1. Further, the dimensional etch bias of the working film 103 was confined within the permissible range (±5 nm).

As described above, even when the intermediate film to be functioned as a mask is irradiated with ultraviolet ray as an energy beam as in this embodiment, it is possible to obtain almost the same effects that can be obtained in Embodiment II-1.

(Comparative Embodiment II-5)

A working film pattern 109 was formed by repeating the same procedures as described in Embodiment II-3 except that the ultraviolet ray was not irradiated onto the intermediate film 104 to be functioned as a mask.

Then, the dimensional etch bias of the working film 103 and the etching rate of the intermediate film 104 in the step of forming a working film pattern 109 with the intermediate film pattern being employed as a mask were measured, while classifying the samples into two groups, i.e. one group wherein the irradiation of ultraviolet ray was performed, the other wherein the irradiation of ultraviolet ray was not performed. Table 15 shows the results measured. Further, the density of the intermediate film 104 was also investigated, the results being shown in Table 16.

In the same manner as in Embodiment II-3, ArF excimer laser was employed as the ultraviolet ray.

TABLE 15

| | Not irradiated with UV beam | | Irradiated with UV beam | |
|---|---|---|---|---|
| | Etch bias (nm) | Etching rate (nm/min.) | Etch bias (nm) | Etching rate (nm/min.) |
| Film of (SS5) | +10.5 | 20.8 | +2.2 | 6.0 |
| Film of (SS6) | +12.3 | 21.9 | +2.1 | 6.9 |

TABLE 16

| | Not irradiated with UV beam | | | Irradiated with UV beam | | |
|---|---|---|---|---|---|---|
| | O/Si (O/Ti) | C/Si (C/Ti) | Density (g/cm$^3$) | O/Si (O/Ti) | C/Si (C/Ti) | Density (g/cm$^3$) |
| Film of (SS5) | 1.95 | 0 | 1.94 | 1.98 | 0 | 2.08 |
| Film of (SS6) | 1.92 | 0 | 1.92 | 1.99 | 0 | 1.98 |

As shown in Table 15, when the irradiation of ultraviolet ray was not performed, the etching rate of the resultant intermediate film was larger than that of the intermediate film formed by the method of (SS5) or (SS6), and hence the etching resistance thereof was poor. Furthermore, the dimensional etch bias of the working film 103 exceeded well over the permissible range (±5 nm).

The reason for the poor etching resistance of the intermediate film 104 when it was not exposed to the irradiation of ultraviolet ray may be attributed to the fact that, as shown in Table 16, the density of the non-irradiated intermediate film was relatively low as compared with the intermediate film which was exposed to the irradiation of ultraviolet ray, so that the non-irradiated intermediate film was not sufficiently densified.

As explained above, it will be seen that, as shown in Embodiment II-3, the irradiation of ultraviolet ray such as ArF excimer laser as an energy beam is effective in improving the etching resistance of the intermediate film to be functioned as a mask.

(Embodiment II-4)

In this embodiment, an energy beam was applied to an intermediate film 104 to be functioned as a mask while heating the intermediate film 104. In this case, a flash lamp was employed as the energy beam 105.

Next, the pattern-forming method of this embodiment will be explained with reference to FIGS. 2A to 2F.

First of all, in the same manner as in Embodiment II-1, a metallic wiring layer 102, an interlayer insulating film (a working film 103), and an intermediate film 104 (masking material) were successively formed on the surface of a silicon substrate 101 having element regions (not shown) formed therein.

By the way, the intermediate film 104 was formed following the methods (SS1) to (SS3) as shown in Embodiment II-1.

Then, as shown in FIG. 2B, an energy beam 105 was irradiated onto the intermediate film 104 by using a beam of flash lamp with the exposure dose being set to 5 J/cm$^2$. In this embodiment, the irradiation of the intermediate film 104 by a flash lamp was performed while heating the silicon substrate 101 up to a temperature of 300° C. by using a hot plate.

In order to prevent the silicon substrate 101 and other components formed over the silicon substrate 101 from being badly affected by this heating, it is desired to control the temperature of the silicon substrate 101 so as not to exceed over 500° C.

Then, the composition ratios of elements of the intermediate film 104 and the density thereof before and after the irradiation of the energy beam 105 were measured. The results are shown in the following Table 17.

TABLE 17

|  | O/Si (O/Ti) | C/Si (C/Ti) | Density (g/cm³) | Etch bias (nm) | Etching rate (nm/min.) |
| --- | --- | --- | --- | --- | --- |
| Film of (SS1) | 1.94 | 0.13 | 2.10 | +2.3 | 6.2 |
| Film of (SS2) | 1.95 | 0.14 | 2.11 | +3.3 | 5.6 |
| Film of (SS3) | 1.96 | 0.18 | 2.21 | +2.6 | 5.8 |

As shown in Table 17, the density of the intermediate film 104 formed according to this embodiment was densified higher than that of Embodiment II-1. The reason for this can be attributed to the fact that, due to the irradiation of energy beam in combination with heating treatment, the temperature of the intermediate film 104 was raised higher than the case of Embodiment II-1.

By the way, just like Embodiment II-1, the deformation or denaturing of the working film 103 and the metallic wiring layer 102 after the irradiation of the energy beam was not recognized at all.

Then, in the same manner as in Embodiment II-1, a resist film 106 was formed on the intermediate film 104 as shown in FIG. 2C. Then, in the same manner as in Embodiment II-1, the resist film 106 was subjected to a patterning exposure, to a baking treatment and to a developing treatment to form a resist pattern 107 as shown in FIG. 2D.

The resultant resist pattern 107 was then employed as a mask to etch the intermediate film 104 in the same manner as in Embodiment II-1 to form an intermediate film pattern 108 (=mask pattern) as shown in FIG. 2E. Further, the resultant intermediate film pattern 108 was then employed as a mask to etch the working film 103 in the same manner as in Embodiment II-1 to form a working film pattern 109 as shown in FIG. 2F.

As shown in Table 17, the intermediate film 104 formed according to this embodiment was far improved in etching resistance as compared with the intermediate films obtained by any of the methods (SS1) through (SS3). Further, the dimensional etch bias of the working film 103 was found further minimized.

As described above, when the irradiation of energy beam was performed in combination with a heating treatment as set forth in this embodiment, the intermediate film to be functioned as a mask can be further densified and at the same time, the dimensional etch bias of the working film can be further minimized.

(Embodiment II-5)

In this embodiment, a beam of flash lamp was employed as an energy beam and was applied to an intermediate film 104 functioning as a mask after a resist pattern has been formed.

Next, the pattern-forming method of this embodiment will be explained with reference to FIGS. 3A to 3F.

First of all, in the same manner as in Embodiment II-1, a metallic wiring layer 202, an interlayer insulating film (a working film 203), and an intermediate film 204 (masking material) were successively formed on the surface of a silicon substrate 201 having element regions (not shown) formed therein.

By the way, the intermediate film 204 was formed following the methods (SS1) to (SS3) as shown in Embodiment II-1.

Figure 3A:
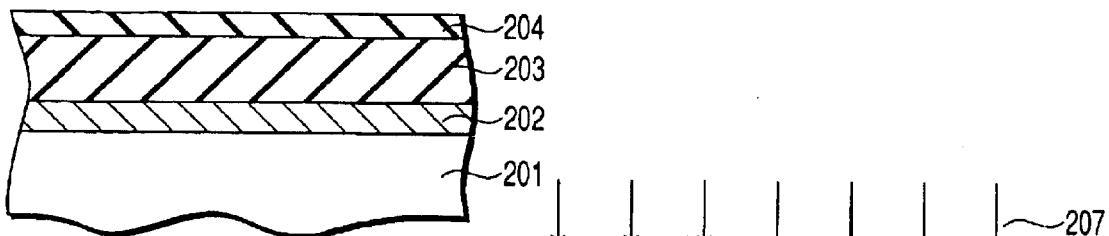
FIGS. 3A to 3F respectively shows a cross-sectional view illustrating in step-wise the process of forming a pattern according to a further embodiment of the present invention.
Figure 3D:
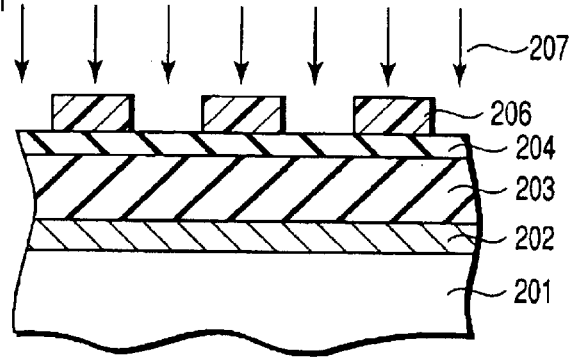
Figure 3B:
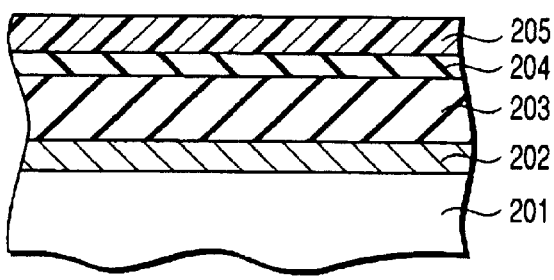

Then, in the same manner as in Embodiment II-1, a resist film 205 was formed on the intermediate film 204 as shown in FIG. 3B. Then, in the same manner as in Embodiment II-1, the resist film 205 was subjected to a patterning exposure, to a baking treatment and to a developing treatment to form a resist pattern 206 as shown in FIG. 3C.

Then, as shown in FIG. 3D, an energy beam 207 was irradiated onto the intermediate film 204 (mask) by using a beam of flash lamp with the exposure dose being set to the same level as that employed in Embodiment II-1.

Then, the composition ratios of elements of the intermediate film 204 and the density thereof before and after the irradiation of the energy beam 207 were measured. The results are shown in the following Table 18.

TABLE 18

|  | O/Si (O/Ti) | C/Si (C/Ti) | Density (g/cm³) | Etch bias (nm) | Etching rate (nm/min.) |
| --- | --- | --- | --- | --- | --- |
| Film of (SS1) | 1.93 | 0.11 | 2.08 | +2.7 | 6.2 |
| Film of (SS2) | 1.96 | 0.13 | 2.09 | +3.7 | 5.6 |
| Film of (SS3) | 1.97 | 0.19 | 2.19 | +3.0 | 6.1 |

As shown in Table 18, due to the irradiation of the energy beam 207, the density of the intermediate film 204 was densified up to the same degree as that of Embodiment II-1. Therefore, it will be seen that the intermediate film 204 functioning as a mask was densified to the same degree as that of Embodiment II-1.

By the way, the deformation or denaturing of the resist pattern 206 after the irradiation of the energy beam 207 was not recognized at all. The reason for this can be attributed to the fact that the resist pattern 206 is incapable of absorbing a light in the output wavelength zone of the flash lamp.

Further, just like Embodiment II-1, the deformation or denaturing of the working film 203 and the metallic wiring layer 202 after the irradiation of the energy beam was not recognized at all.

Figure 3E:
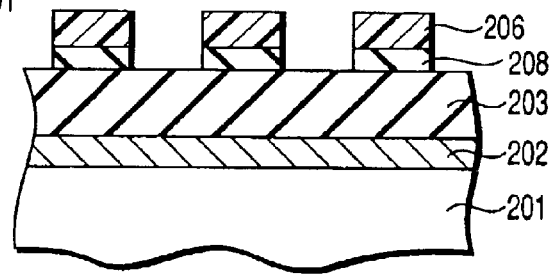
Figure 3C:
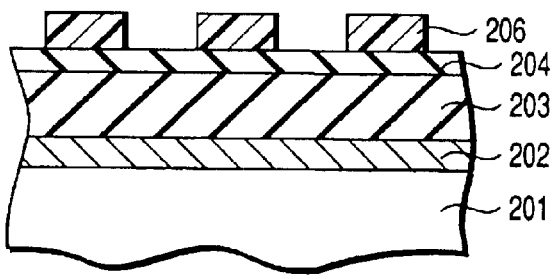
Figure 3F:
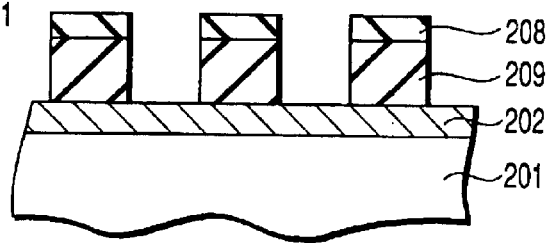

The resultant resist pattern 206 was then employed as a mask to dry-etch the intermediate film 204 in the same manner as in Embodiment II-1 to form an intermediate film pattern 208 (=mask pattern) as shown in FIG. 3E. Further, the resultant intermediate film pattern 208 was then employed as a mask to etch the working film 203 in the same manner as in Embodiment II-1 to form a working film pattern 209 as shown in FIG. 3F.

As shown in Table 18, in this embodiment also, the intermediate film 204 was improved in etching resistance which was comparable with the intermediate films obtained in Embodiment II-1. Therefore, the dimensional etch bias of the working film 203 was found to fall within the permissible range of ±5 nm.

As described above, even if the irradiation of energy beam to the intermediate film employed as a mask is performed after the formation of the resist pattern, almost the same effects obtainable in Embodiment II-1 can be obtained.

(Embodiment II-6)

In this embodiment, an energy beam was applied to a patterned intermediate film, and then, a pattern was transcribed onto a working film with the intermediate film pattern being employed as a mask.

Next, the pattern-forming method of this embodiment will be explained with reference to FIGS. 4A to 4F.

First of all, in the same manner as in Embodiment II-1, a metallic wiring layer 302, an interlayer insulating film (a working film 303), and an intermediate film 304 (masking material) were successively formed on the surface of a silicon substrate 301 having element regions (not shown) formed therein.

Figure 4A:
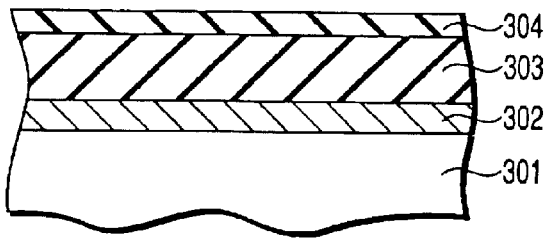
FIGS. 4A to 4F respectively shows a cross-sectional view illustrating in step-wise the process of forming a pattern according to a further embodiment of the present invention.
Figure 4B:
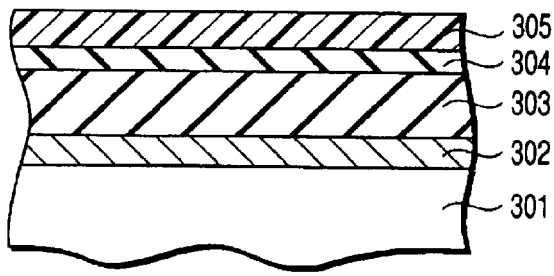
Figure 4C:
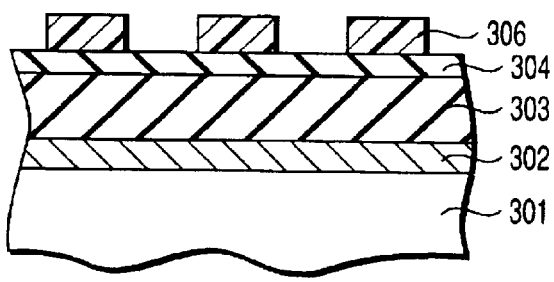

Then, in the same manner as in Embodiment II-1, a resist film 305 was formed on the intermediate film 304 as shown in FIG. 4B. Then, in the same manner as in Embodiment II-1, the resist film 305 was subjected to a patterning exposure, to a baking treatment and to a developing treatment to form a resist pattern 306 as shown in FIG. 4C.

Figure 4D:
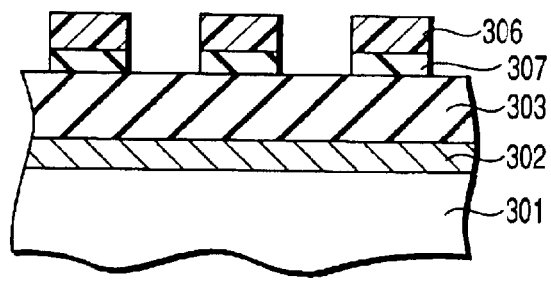

Then, by using the resultant resist pattern 306 as a mask, the etching was performed by the same procedures as those of Embodiment II-1 to form an intermediate film pattern 307 (=mask pattern) as shown in FIG. 4D.

Figure 4E:
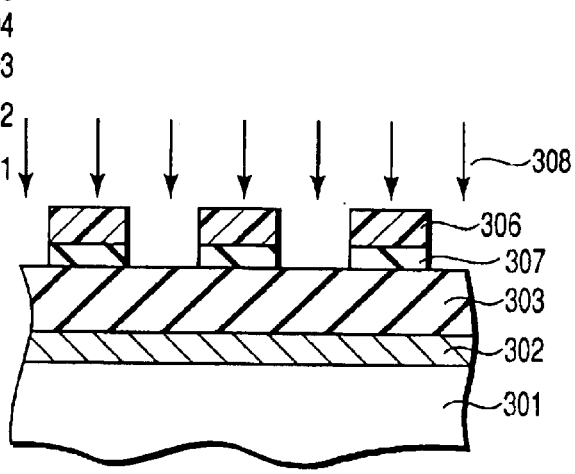

Then, as shown in FIG. 4E, an energy beam 308 was irradiated onto the intermediate film pattern 307 (=mask pattern). In this embodiment, a beam of flash lamp was employed as the energy beam 308 and the irradiation was performed under the same conditions as employed in Embodiment II-1. As a result of the irradiation of the energy beam 308, the intermediate film pattern 307 was densified to the same magnitude as that of Embodiment II-1, thus forming an intermediate film pattern 307-1.

After the irradiation of the energy beam 308, the composition ratios of elements of the intermediate film pattern 307 and the density of the intermediate film pattern 307 were measured. The results are shown in Table 19.

By the way, the deformation or denaturing of the resist pattern 306 was not recognized at all. The reason for this can be attributed to the fact that the resist pattern 306 is incapable of absorbing a light in the output wavelength zone of the flash lamp.

Further, just like Embodiment II-1, the deformation or denaturing of the metallic wiring layer 302 and of the working film 303 was not recognized at all.

Figure 4F:
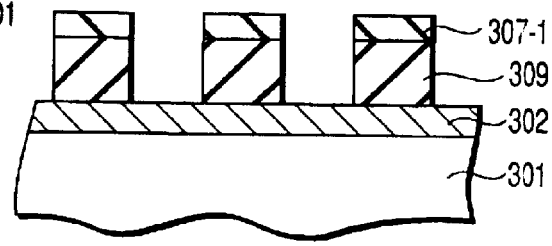

The intermediate film pattern 307 was then employed as a mask to dry-etch the working film 303 in the same manner as in Embodiment II-1 to form an working film pattern 309 as shown in FIG. 4F.

Then, the etching rate of the intermediate film and the dimensional etch bias of the working film 303 in the etching step of the working film 303 were measured. Table 19 shows the results measured.

TABLE 19

| | O/Si (O/Ti) | C/Si (C/Ti) | Density (g/cm³) | Etch bias (nm) | Etching rate (nm/min.) |
|---|---|---|---|---|---|
| Film of (SS1) | 1.95 | 0.13 | 2.08 | +2.5 | 6.4 |
| Film of (SS2) | 1.95 | 0.15 | 2.09 | +3.5 | 5.8 |
| Film of (SS3) | 1.91 | 0.21 | 2.19 | +2.8 | 6.2 |

As shown in Table 19, the intermediate film 304 according to this embodiment exhibited almost the same degree of etching resistance as those of Embodiment II-1. Further, the dimensional etch bias of the working film 303 was confined within the permissible range (±5 nm).

As shown in this embodiment, even if the irradiation of energy beam is applied to an intermediate film after the intermediate film functioning as a mask has been formed into an intermediate film pattern, almost the same effects obtainable in Embodiment II-1 can be obtained.

As described above, according to the present invention, it is possible to make the resist film thinner and at the same time, to ensure a sufficient thickness of mask by using a mask which can be formed into a film by coating. Therefore, it is now possible provide a pattern-forming method which makes it possible to work a working film with a minimized dimensional etch bias and with an excellent dimensional accuracy.

Therefore, the present invention would be very useful for a fine working in the manufacturing a semiconductor device, and hence is very valuable in industrial viewpoint.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a pattern comprising:
coating a solution containing a compound having a silicon-nitrogen linkage in the main chain thereof and represented by the following general formula on a surface of a working film to form a mask,

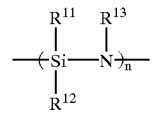

wherein $R^{11}$, $R^{12}$, and $R^{13}$, which may be identical or different, are each chosen from a nitrogen atom, a hydrogen atom, and substituted and unsubstituted aliphatic hydrocarbons and aromatic hydrocarbons comprising from 1 to 20 carbon atoms; and n is an integer;
replacing said nitrogen in said mask by oxygen to obtain a silicon oxide-like film;
forming a resist film on a surface of said silicon oxide-like film;
forming a resist pattern by subjecting said resist film to a patterning exposure and to a developing treatment;
transcribing said resist pattern to said silicon oxide-like film to form a masking pattern of said silicon oxide-like film; and
transcribing said masking pattern of said silicon oxide-like film to said working film to for a working film pattern.

2. The method for forming a pattern according to claim 1, wherein said compound having a silicon-nitrogen linkage in the main chain contain nitrogen at a ratio of 5 to 80% by weight.

3. The method for forming a pattern according to claim 1, wherein at least 20% of said nitrogen in said mask is replaced by oxygen.

4. The method for forming a pattern according to claim 3, wherein at least 80% of said nitrogen in said mask is replaced by oxygen.

5. The method for forming a pattern according to claim 1, wherein the replacement of said nitrogen by oxygen is performed by a heating of said mask or by an irradiation of an energy beam to said mask.

6. The method for forming a pattern according to claim 5, wherein the heating of said mask is performed at a temperature ranging from 200 to 500° C.

7. The method for forming a pattern according to claim 5, wherein said energy beam is a light beam having a wavelength selected from the range of 1 nm to 1 mm or an electron beam.

8. The method for forming a pattern according to claim 7, wherein said energy beam is a light beam having a wavelength selected from the range of 1 nm to 1 mm, and the exposure dose of said light beam is in the range of 1 mJ/cm² to 1000 J/ cm².

9. The method for forming a pattern according to claim 7, wherein said energy beam is an electron beam, and the exposure dose of said electron beam is in the range of 1 $\mu C/cm^2$ to 1000 $C/cm^2$.

10. The method for forming a pattern according to claim 5, wherein the replacement of said nitrogen in said mask by oxygen is performed by exposing said mask to an atmosphere containing water vapor and oxygen.

11. The method for forming a pattern according to claim 10, wherein said atmosphere has a humidity of 10% or more, and the concentration of said oxygen is 10% or more.

12. The method for forming a pattern according to claim 1, wherein said working film includes a compound containing carbon atom.

13. The method for forming a pattern according to claim 12, which further comprises transcribing said working film pattern to a thin film formed in advance on an underside of said working film to obtain a thin film pattern.

14. The method for forming a pattern according to claim 13, wherein said thin film formed on an underside of said working film is an interlayer insulating film.

15. The method for forming a pattern according to claim 1, wherein said working film pattern is formed by a dry etching method using a source gas containing at least one kind of gas selected from the group consisting of oxygen, nitrogen, chlorine and bromine.

16. The method for forming a pattern according to claim 1, wherein said resist film is formed of a chemical amplification type resist, and said mask is heated immediately before forming said resist film to remove any material capable of deactivating an acid to be generated in said chemical amplification type resist.

17. The method for forming a pattern according to claim 16, wherein heating of said mask is performed at a temperature ranging from 150° C. to 500° C.

18. The method for forming a pattern according to claim 1, which further comprises subjecting said mask to a hydrophobilizing treatment prior to forming said resist film on said mask.

19. The method for forming a pattern according to claim 18, which further comprises heating said mask after said hydrophobilizing treatment but prior to forming said resist film to remove any by-product generated in said hydrophobilizing treatment from said mask.

20. The method for forming a pattern according to claim 1, wherein said resist film is formed of a chemical amplification type resist, and a thin film capable of deactivating an acid to be generated in said chemical amplification type resist is formed on a surface of said mask prior to forming said resist film on the surface of said mask.

21. A method for manufacturing a semiconductor device comprising:

forming a working film on a surface of a semiconductor substrate having element regions formed therein;

coating a solution containing a compound having a silicon-nitrogen linkage in the main chain thereof and represented by the following general formula on a surface of a working film to form a mask,

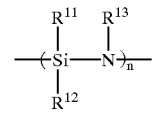

wherein $R^{11}$, $R^{12}$, and $R^{13}$, which may be identical or different, are each chosen from a nitrogen atom, a hydrogen atom, and substituted and unsubstituted aliphatic hydrocarbons and aromatic hydrocarbons and aromatic hydrocarbons comprising from 1 to 20 carbon atoms; and n is an integer;

replacing said nitrogen in said mask by oxygen to obtain a silicon oxide-like film;

forming a resist film on a surface of said silicon oxide-like film;

forming a resist pattern by subjecting said resist film to a patterning exposure and to a developing treatment;

transcribing said resist pattern to said silicon oxide-like film to form a masking pattern of said silicon oxide-like film; and transcribing said masking pattern of said silicon oxide-like film to said working film to for a working film pattern.

* * * * *

UNITED STATES PATENT AND TRADEMARK OFFICE
CERTIFICATE OF CORRECTION

PATENT NO. : 6,806,021 B2
DATED : October 19, 2004
INVENTOR(S) : Sato et al.

It is certified that error appears in the above-identified patent and that said Letters Patent is hereby corrected as shown below:

Column 44,
Line 40, change "to for" to -- to form --.
Line 44, change "contain" to -- contains --.
Line 67, change "J/ cm$^2$" to -- J/cm$^2$ --.

Column 46,
Lines 26-27, delete "and aromatic hydrocarbons" (second occurrence).
Line 41, change "to for" to -- to form --.

Signed and Sealed this

Fifth Day of April, 2005

JON W. DUDAS
*Director of the United States Patent and Trademark Office*